(12) United States Patent
Hayashi et al.

(10) Patent No.: US 6,552,407 B1
(45) Date of Patent: Apr. 22, 2003

(54) COMMUNICATION MODULE HAVING A STRUCTURE FOR REDUCING CROSSTALK

(75) Inventors: Kiyoshi Hayashi, Takamatsu (JP); Takashi Harada, Hidaka (JP); Satoshi Ueno, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/674,364

(22) PCT Filed: Sep. 7, 1998

(86) PCT No.: PCT/JP98/04005

§ 371 (c)(1),
(2), (4) Date: Oct. 31, 2000

(87) PCT Pub. No.: WO00/14794

PCT Pub. Date: Mar. 16, 2000

(51) Int. Cl.$^7$ .......................... H01L 31/062; H01L 29/00
(52) U.S. Cl. .......................... 257/507; 257/290; 257/510; 257/516; 257/517; 257/526
(58) Field of Search ................. 257/507, 510, 257/517, 526, 290, 291, 292, 293, 294, 516, 518, 520

(56) References Cited

U.S. PATENT DOCUMENTS 6,229,165 B1 * 5/2001 Sakai et al. ................. 257/291

FOREIGN PATENT DOCUMENTS

| JP | 62-71265 | 4/1987 |
|----|----------|--------|
| JP | 2-170468 | 7/1990 |
| JP | 8-18009 | 1/1996 |
| JP | 9-270515 | 10/1997 |
| JP | 9-289323 | 11/1997 |

OTHER PUBLICATIONS

ICD issued by Institute of Electronics, Information and Communication Engineers, ICD96–116, "1.4Gb/sx12–channel LD Driver IC for Optical Interconnection", pp. 47–54.

* cited by examiner

*Primary Examiner*—Minh Loan Tran
(74) *Attorney, Agent, or Firm*—Mattingly, Stranger & Malur, P.C.

(57) ABSTRACT

Disclosed herein is a communication module, comprising a semiconductor chip in which channels for allowing signal converting means to convert current signals inputted from input terminals to voltage signals and outputting the same from output terminals respectively are arranged in parallel in plural form, and wherein the semiconductor chip is comprised principally of a semiconductor substrate in which a second semiconductor layer is provided on a first semiconductor layer with an insulating layer interposed therebetween, each of the signal converting means is formed in a channel forming region of the second semiconductor layer, which is defined for each channel, and the input and output terminals are formed on the channel forming regions of the second semiconductor layer with the insulating layer interposed therebetween. In the communication module, the first semiconductor layer is formed with resistivity smaller than that of the second semiconductor layer and fixed to a fixed potential, whereby the amount of transfer of noise power developed through the substrate can be lessened and crosstalk developed between adjacent channels can be reduced.

17 Claims, 17 Drawing Sheets

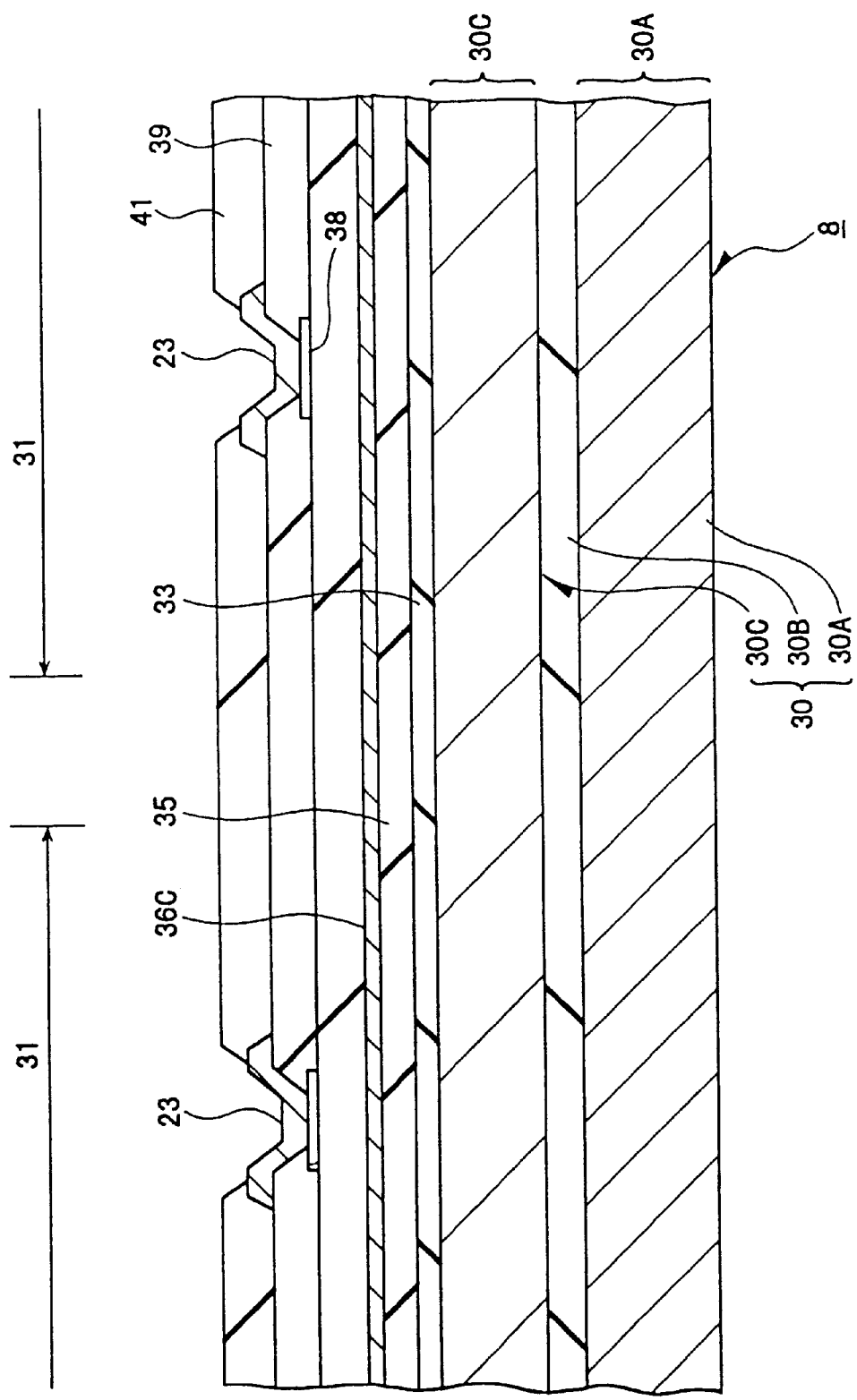

COMMUNICATION MODULE HAVING A STRUCTURE FOR REDUCING CROSSTALK

TECHNICAL FIELD

The present invention relates to a communication module, and particularly to a technology effective for application to communication modules (such as a transmitting module and a receiving module) suitable for use in an optical interconnect communication system.

BACKGROUND ART

An attempt has been made to transmit data within or between apparatuses such as an exchanger, a parallel computer, a general-purpose large computer, etc. through the use of an optical interconnect communication system. Several transmission modes or systems are considered as for the optical interconnect communication system. However, a parallel data transmission mode capable of achieving simplification of the system, a size reduction in the system, etc. has been considered to be promising.

The optical interconnect communication system of the parallel data transmission mode principally includes a transmitting module for converting electric signals to their corresponding light signals, an optical fiber array cable, and a receiving module for converting the light signals to their corresponding electric signals. The transmitting module has a semiconductor chip (hereinafter called "transmitting IC (Integrated Circuit)") in which channels for allowing signal converting means to convert voltage signals inputted from input terminals to current signals and outputting the same from output terminals, respectively are arranged in parallel in plural form, a light-emitting device array unit in which laser diodes for respectively converting the electric signals outputted from the output terminals of the transmitting IC to light signals are arranged in parallel in plural form, and a lens array unit in which micro lenses are arranged in parallel in plural form. The transmitting module takes a structure wherein these are accommodated or held in a metal package. The receiving module includes a lens array unit wherein micro lenses are arranged in parallel in plural form, a photoreceptor or light-detecting device array unit wherein photodiodes for respectively converting light signals to electric signals are arranged in parallel in plural form, and a semiconductor chip (hereinafter called "receiving IC") wherein channels for respectively converting current signals inputted from input terminals to voltage signals through the use of signal converting means and outputting them from output terminals are arranged in parallel in plural form. The receiving module has a structure wherein these are held in a metal package.

On the other hand, since each of the transmitting IC and the receiving IC takes a multi-channel circuit configuration in the case of the parallel data transmission mode, crosstalk is apt to occur between adjacent channels. Therefore, the technology of reducing the crosstalk developed between the adjacent channels in the transmitting IC to −21 [dB] has been described in "ICD issued by Institute of Electronics, Information and Communication Engineers, ICD96-116, p.47–54 "1.4 Gb/sx12-channel LD Driver IC for Optical Interconnection".

In the transmitting IC, however, those other than light-emitting device drive circuits for respectively driving the laser diodes are held at a problem-free level because they are digitally operated, whereas in the case of the implementation of the receiving IC, a crosstalk of about 80 [mV] occurs between the adjacent channels if 800 [mV] is taken as internal logic amplitude. Since the receiving IC handles a small signal converted to a current by each photodiode, the crosstalk developed between the adjacent channels becomes critical. Assuming that the input impedance of an input preamplifier circuit used in a first stage is 1 [kΩ], for example, the crosstalk of 80 [mV] becomes equivalent to an input noise current of 80 [μA].

On the other hand, since several tens of [μA] are commonly used as the minimum signal input current, the crosstalk developed between the adjacent channels leads to fatality. According to the above-described reference, it describes that if the channels are spaced 1 [mm] from each other, then the crosstalk developed between the adjacent channels is reduced to near 30 [dB]. Even in this case, however, the receiving IC will suffer a crosstalk noise of about 25 [μA], and hence a system margin is significantly reduced.

On the other hand, the technology of interposing a buffer area or zone for inhibiting the motion of carriers between each of memory cells and its corresponding switching circuit with a view toward preventing damage of memory information due to a parasitic bipolar element in an SRAM using a Bi-CMOS (Bipolar-Complementary Metal Oxide Semiconductor) technology is disclosed in Japanese Unexamined Patent Publication No. Sho 62-71265. The present technology can be applied even to a problem of crosstalk developed between adjacent channels in transmitting and receiving modules employed in an optical intercorrect communication system. A certain degree of effect can be expected by providing a buffer zone between an input preamplifier circuit and a digital circuit portion. However, crosstalk developed through a substrate cannot be ignored at a high frequency. Since no countermeasures are taken against the substrate, a sufficient effect cannot be achieved.

An object of the present invention is to provide a technology capable of reducing channel-to-channel crosstalk.

Another object of the present invention is to provide a technology capable of increasing the reliability of a communication module.

The above, other objects and novel features of the present invention will become apparent from the description of the present specification and the accompanying drawings.

DISCLOSURE OF THE INVENTION

A summary of typical ones of the inventions disclosed in the present application will be described in brief as follows:

(1) There is provided a communication module comprising:

a semiconductor chip in which channels for allowing signal converting means to convert current signals inputted from input terminals to voltage signals and outputting the same from output terminals respectively are arranged in parallel in plural form; and wherein the semiconductor chip is comprised principally of a semiconductor substrate in which a second semiconductor layer is provided on a first semiconductor layer with an insulating layer interposed therebetween, the signal converting means is formed in a channel forming region of the second semiconductor layer, which is defined for each channel, the input and output terminals are formed on the channel forming regions of the second semiconductor layer with the insulating layer interposed therebetween, and the first semiconductor layer is formed with resistivity smaller than that of the second semiconductor layer and fixed to a fixed potential.

(2) In the communication module described in the means (1), a conductive layer electrically separated from the channel forming regions and fixed to a reference potential is provided between the channel forming regions of the second semiconductor layer.

(3) In the communication module described in the means (1), each signal converting means referred to above has an input preamplifier circuit which performs an analog operation, and an internal circuit and an output circuit both of which are digitally operated, the input preamplifier circuit is formed in an input circuit forming portion of the channel forming region of the second semiconductor layer, the internal circuit is formed in an internal circuit forming portion of the channel forming region of the second semiconductor layer, the output circuit is formed in an output circuit forming portion of the channel forming region of the second semiconductor layer, and the input circuit forming portion of the channel forming region of the second semiconductor layer is enclosed on all sides by a conductor electrically isolated from each channel forming region referred to above and fixed to the fixed potential.

(4) In the communication module described in the means (1), the signal converting means referred to above has an input preamplifier circuit which performs an analog operation, and an internal circuit and an output circuit both of which are digitally operated, the input preamplifier circuit is formed in an input circuit forming portion of the channel forming region of the second semiconductor layer, the internal circuit is formed in an internal circuit forming portion of the channel forming region of the second semiconductor layer, the output circuit is formed in an output circuit forming portion of the channel forming region of the second semiconductor layer, and the preamplifier circuit forming portion, the internal circuit forming portion and the output circuit forming portion of each channel forming region of the second semiconductor layer are respectively enclosed on all sides by the conductor electrically separated from the channel forming region and fixed to the reference potential.

(5) In the communication module described in any of the means (2) through (4), the conductive layer is electrically separated from the channel forming regions of the second semiconductor layer by insulating layers reaching the insulating layer in the direction of the depth of the second semiconductor layer from the surface thereof.

(6) In the communication module described in the means (3), each of the input terminals is formed on the input circuit forming portion of the channel forming region of the second semiconductor layer.

(7) In the communication module described in the means (3), each of the input terminals is formed on the input circuit forming portion and each of the output terminals is formed on the output circuit forming portion.

(8) There is provided a communication module comprising:

a semiconductor chip in which channels for allowing signal converting means to convert current signals inputted from input terminals to voltage signals and outputting the same from output terminals respectively are arranged in parallel in plural form; and wherein the semiconductor chip is comprised principally of a semiconductor substrate in which a second semiconductor layer is provided on a first semiconductor layer with an insulating layer interposed therebetween, the signal converting means is formed in a channel forming region of the second semiconductor layer, which is defined for each channel, the input and output terminals are formed on the channel forming regions of the second semiconductor layer with the insulating layer interposed therebetween, and a conductor fixed to a reference potential is provided between the input terminals and the second semiconductor layer.

(9) In the communication module described in the means (8), a conductor fixed to the reference potential is provided between the output terminals and the second semiconductor layer.

According to the above means (1) through (7), since the amount of transfer of noise power developed through the substrate can be rendered small, channel-to-channel crosstalk can be reduced.

Further, since the channel-to-channel crosstalk can be reduced, the communication module can be increased in reliability.

According to the above means (8) and (9), since the substrate and the terminals can be separated from one another, the amount of transfer of noise power developed through the substrate can be lessened and hence channel-to-channel crosstalk can be reduced.

It is also possible to increase the reliability of the communication module because the channel-to-channel crosstalk can be reduced.

BRIEF DESCRIPTION OF THE DRAWINGS

FIG. 19 is a cross-sectional view of a receiving IC placed in a receiving module employed in the optical interconnect communication system showing the embodiment 2 of the present invention.

BEST MODE FOR CARRYING OUT THE INVENTION

Figure 1:
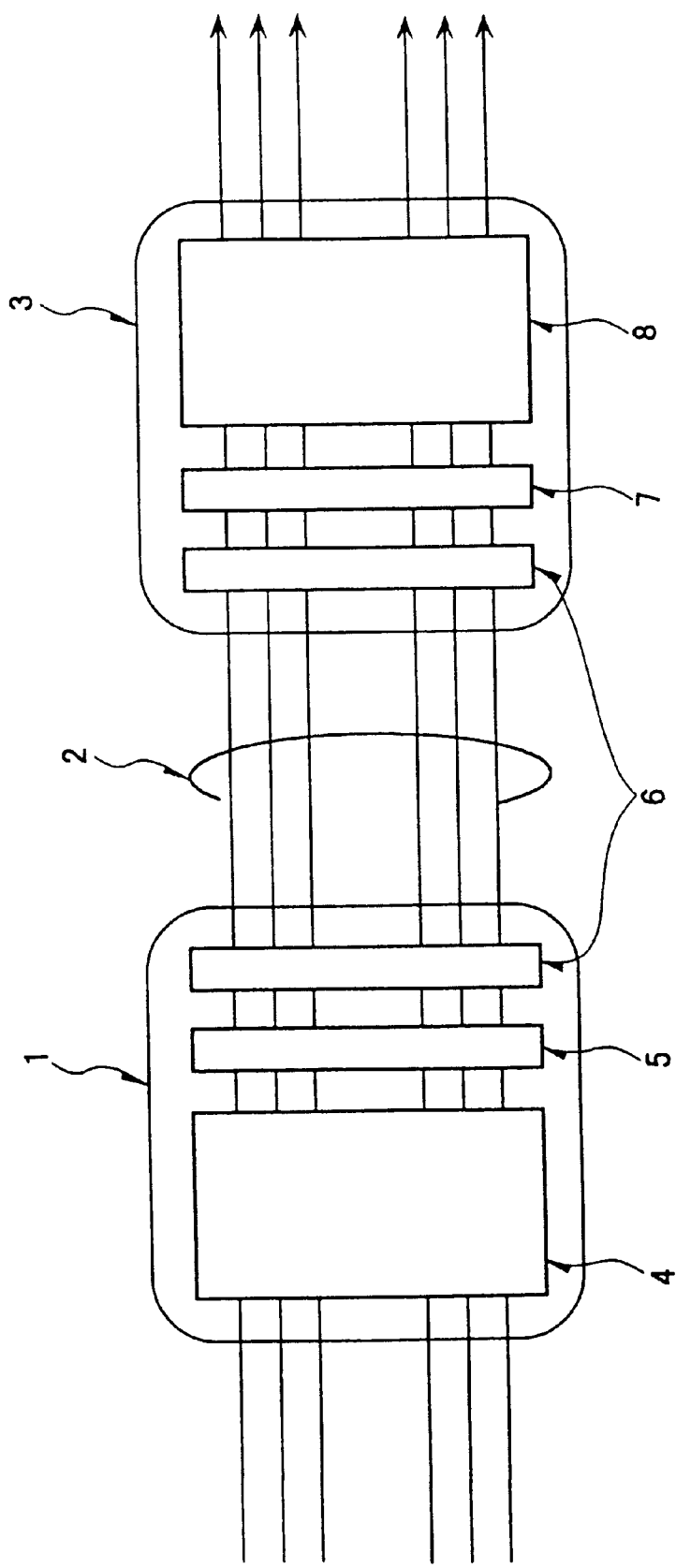
FIG. 1 is a schematic configurational diagram of an optical interconnect communication system showing an embodiment 1 of the present invention.

The construction of the present invention will hereinafter be described in conjunction with embodiments.

Incidentally, ones each having the same function in all the drawings for describing the embodiments are identified by the same reference numerals, and their repetitive description will therefore be omitted.

(Embodiment 1)

As shown in FIG. 1, an optical interconnect communication system according to the present embodiment principally comprises a transmitting module 1 for converting electric signals to light signals, an optical fiber array cable 2, and a receiving module 3 for converting light signals to electric signals. The present optical interconnect communication system comprises a parallel data transmission system and is used for the transmission of data within or between apparatuses such as an exchanger, a parallel computer, a general-purpose large computer, etc.

Figure 7:
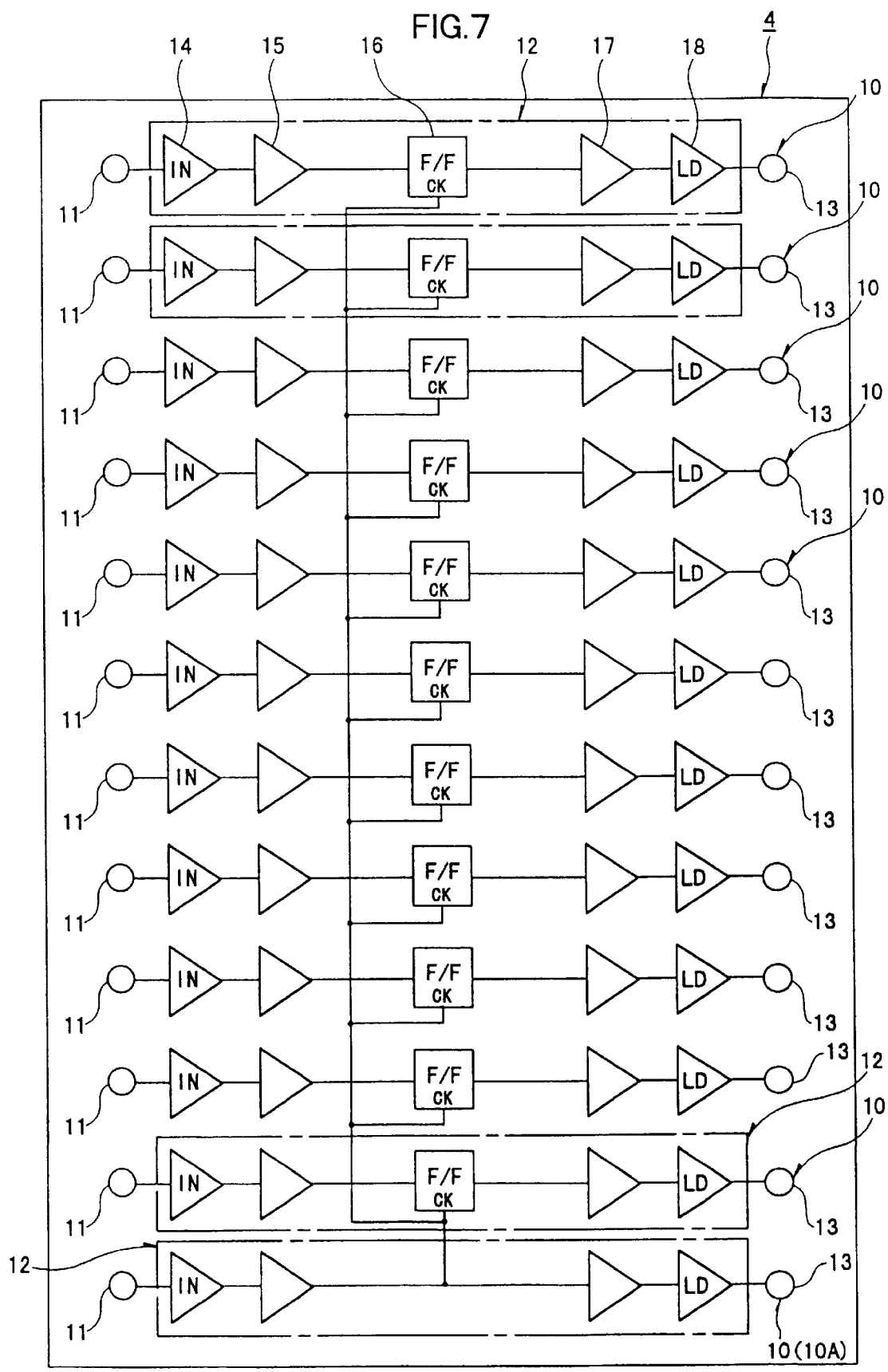
FIG. 7 is a block diagram showing a circuit configuration of a transmitting IC (semiconductor chip) shown in FIG. 1.

As shown in FIGS. 1 and 7, the transmitting module 1 has a transmitting IC (semiconductor chip) 4 wherein channels 10 for respectively converting voltage signals inputted from input terminals (electrode pads) 11 to current signals through signal converting means 12 and outputting them from output terminals (electrode pads) 13 are arranged in parallel in plural form, a light-emitting device array unit 5 wherein laser diodes for respectively converting the electric signals outputted from the output terminals 13 of the transmitting IC 4 to light signals are arranged in parallel in plural form, and a lens array unit 6 wherein micro lenses are arranged in parallel in plural form. The transmitting module 1 takes a structure wherein these are accommodated or held in a metal package.

Figure 2:
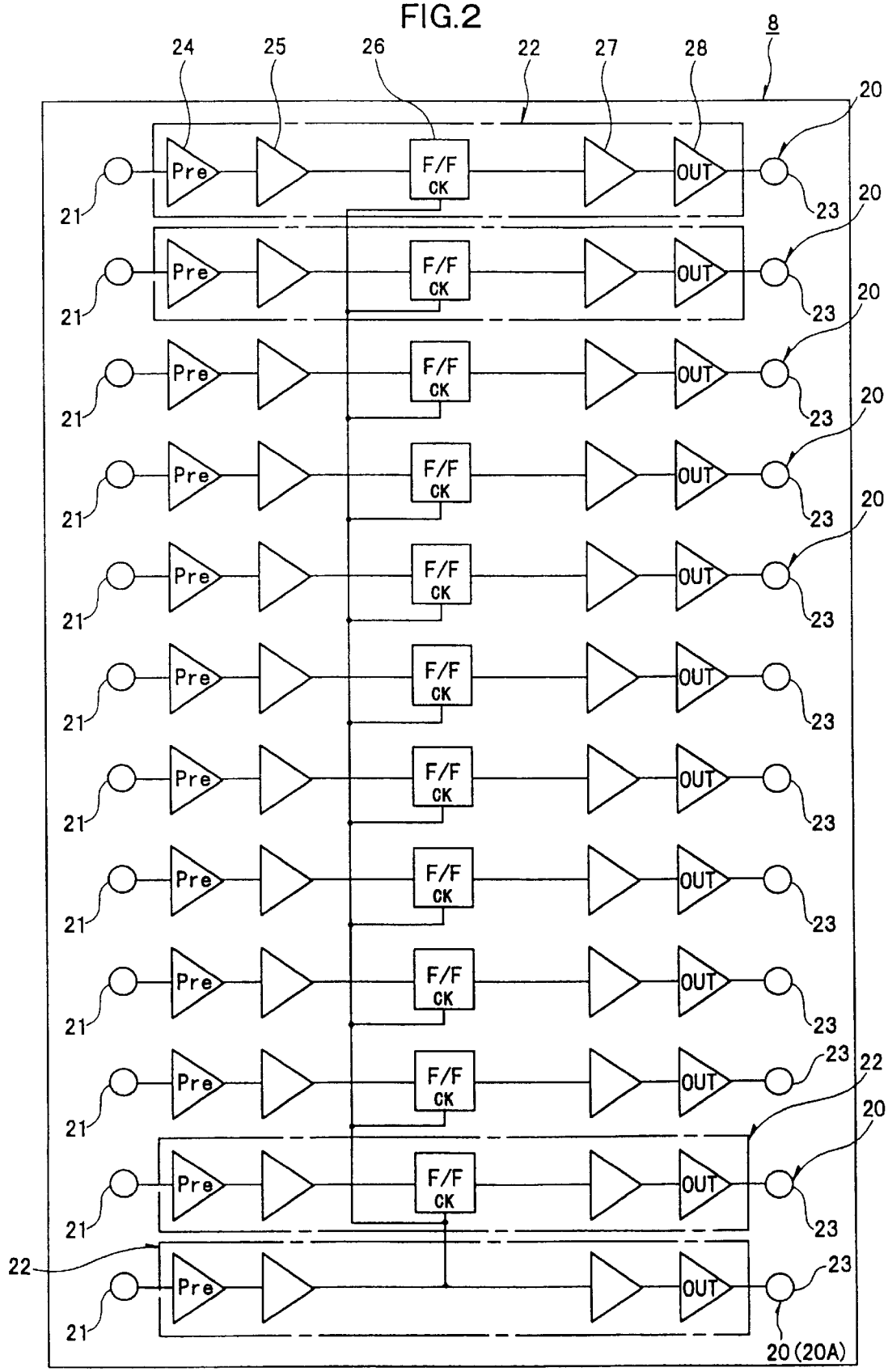
FIG. 2 is a block diagram illustrating a circuit configuration of a receiving IC (semiconductor chip) shown in FIG. 1.

As shown in FIGS. 1 and 2, the receiving module 3 includes a lens array unit 6 wherein micro lenses are arranged in parallel in plural form, a photoreceptor or light-detecting device array unit 7 wherein photodiodes for respectively converting light signals to electric signals are arranged in parallel in plural form, and a receiving IC (semiconductor chip) 8 wherein channels 20 for respectively converting current signals inputted from input terminals 21 to voltage signals through the use of signal converting means 22 and outputting them from output terminals 23 are arranged in parallel in plural form. The receiving module 3 has a structure wherein these are held in a metal package. The respective electric signals outputted from the photoreceptor array unit 7 are inputted to their corresponding input terminals 21 of the receiving IC 8.

As shown in FIG. 7, the transmitting IC 4 has a 12-channel circuit configuration, for example, although not necessarily limited to it. The 12th channel (corresponding to the twelfth as counted from above in the drawing) is a clock signal-dedicated channel and performs a channel-to-channel skew correction and the supply of a clock to the receiving module.

The signal converting means 12 of the first through eleventh channels 10 respectively have input buffer circuits 14, internal buffer circuits 15, timing control circuits 16, internal buffer circuits 17, light-emitting device drive circuits 18, etc. Each of the input buffer circuit 14, the internal buffer circuit 15, the timing control circuit 16 and the internal buffer circuit 17 digitally operates, and the light-emitting device drive circuit 18 performs an analog operation. The timing control circuit 16 comprises a flip-flop circuit and is operated based on a clock signal inputted to a twelfth clock signal-dedicated channel 10A. Namely, electric signals inputted to the first through eleventh channels 10 are controlled in timing by their corresponding timing control circuits 16. Incidentally, the signal converting means 12 of the twelfth clock signal-dedicated channel 10A includes an input buffer circuit 14, an internal buffer circuit 15, an internal buffer circuit 17, a light-emitting device drive circuit 18, etc.

As shown in FIG. 2, the receiving IC 8 takes a 12-channel circuit configuration in a manner similar to the transmitting IC 4. The twelfth channel (corresponding to the twelfth as counted from above in the drawing) is a clock signal-dedicated channel and performs a channel-to-channel skew correction.

The signal converting means 22 of the first through eleventh channels 20 respectively have input preamplifier circuits 24, internal buffer circuits 25, timing control circuits 26, internal buffer circuits 27, output buffer circuits 28, etc. Each of the input preamplifier circuits 24 performs an analog operation, whereas each of the internal buffer circuit 25, the timing control circuit 26, the internal buffer circuit 27 and the output buffer circuit 28 digitally operates. The timing control circuit 26 comprises a flip-flop circuit and is operated based on a clock signal inputted to a twelfth clock signal-dedicated channel 20A. Namely, electric signals inputted to the first through eleventh channels 20 are controlled in timing by their corresponding timing control circuits 16. Incidentally, the signal converting means 12 of the twelfth clock signal-dedicated channel 20A includes an input preamplifier circuit 24, an internal buffer circuit 25, an internal buffer circuit 27, an output buffer circuit 28, etc.

Figure 4:
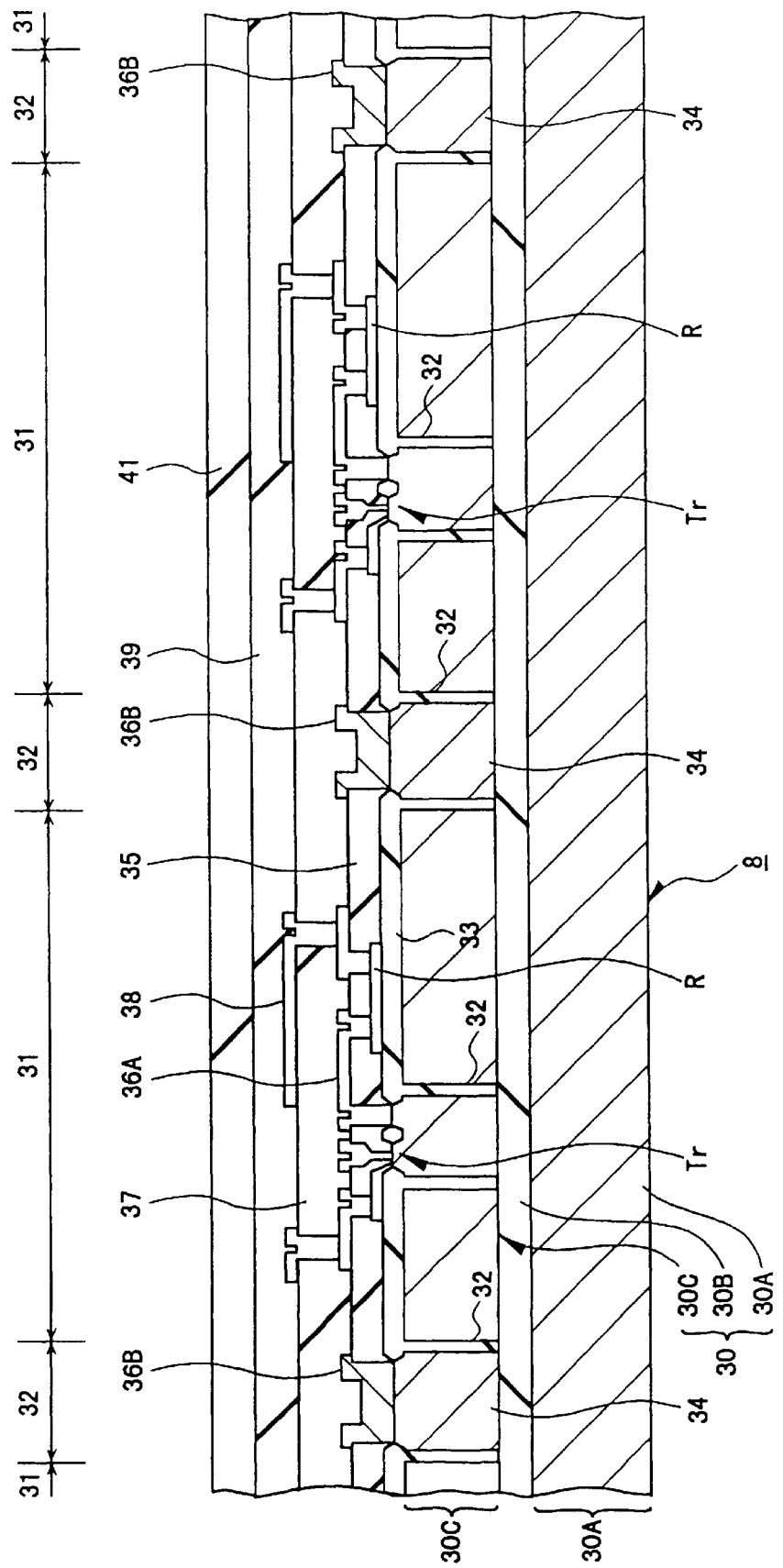
FIG. 4 is a cross-sectional view cut at a position taken along line A—A shown in FIG. 3.

As shown in FIG. 4, the receiving IC 8 shown in FIG. 2 principally comprises a semiconductor substrate 30 in which a semiconductor layer 30C is provided over a semiconductor layer 30A with an insulating layer 30B interposed therebetween. The semiconductor layer 30A is formed of a n-type semiconductor substrate comprised of monocrystal silicon, for example, the insulating layer 30B is formed of a silicon oxide film, for example, and the semiconductor layer 30C comprises the n-type semiconductor substrate comprised of the monocrystal silicon, for example, respectively. Namely, the semiconductor substrate 30 is formed with an SOI (silicon On Insulator) structure.

The semiconductor layer 30A is formed with a thickness of about 410 [$\mu$m], for example. It is formed with a resistivity of about 0.02 [$\Omega$cm], for example. The semiconductor layer 30C is formed with a thickness of about 1.9 [$\mu$m], for example. It is formed with a resistivity of about 10 [$\Omega$cm], for example. The insulating layer 30B is formed with a thickness of 0.5 [$\mu$m], for example. Namely, the semiconductor layer 30A employed in the present embodiment is formed with resistivity smaller than that of the semiconductor layer 30C. Further, the semiconductor layer 30A is fixed to a reference potential (e.g., 0 [V] potential).

As shown in FIG. 4, each signal converting means 22 shown in FIG. 2 is formed in a channel forming region 31 of the semiconductor layer 30C defined for each channel. Although not shown in detail in the drawing, bipolar transistor elements Tr are shown in FIG. 4 as transistor elements which constitute the signal converting means 22. The bipolar transistor element Tr is formed in an element forming region of the semiconductor layer 30C in each channel forming region 31. The element forming region of the semiconductor layer 30C is enclosed on all sides by insulators 32 embedded into trenches which reach the insulating layer 30B as viewed in the direction of the depth of the semiconductor layer 30 from the surface thereof, and is electrically separated from another element forming region. A field insulating film 33 is provided over each element-to-element separation region of the semiconductor layer 30C. The insulator 33 and the field insulating film 33 are respectively formed of a silicon oxide film, for example.

Each of resistive elements R is provided on the channel forming region 31 of the semiconductor layer 30C with the field insulating film 33 interposed therebetween. The resistive element R is formed of a polycrystalline silicon film, for example.

An interlayer dielectric 35 is provided on the semiconductor layer 30C. Wirings 36A and 36B or the like formed in a wiring layer corresponding to a first layer extend over the interlayer dielectric 35. An interlayer dielectric 37 is provided on the wiring layer corresponding to the first layer. Wirings 38 or the like formed in a wiring layer corresponding to a second layer extend over the interlayer dielectric 37. Further, an interlayer dielectric 39 is provided on the wiring layer corresponding to the second layer. Wirings 40 (see FIG. 6) or the like formed in a wiring layer corresponding to a third layer extend over the interlayer dielectric 39. A final protective film 41 is provided on the wiring layer corresponding to the third layer. The interlayer dielectrics (35, 37 and 39) and the final protective film 41 are respectively formed of the silicon oxide film, for example. The wirings provided in the respective wiring layers are formed of an aluminum film or an aluminum alloy film, for example.

Figure 3:
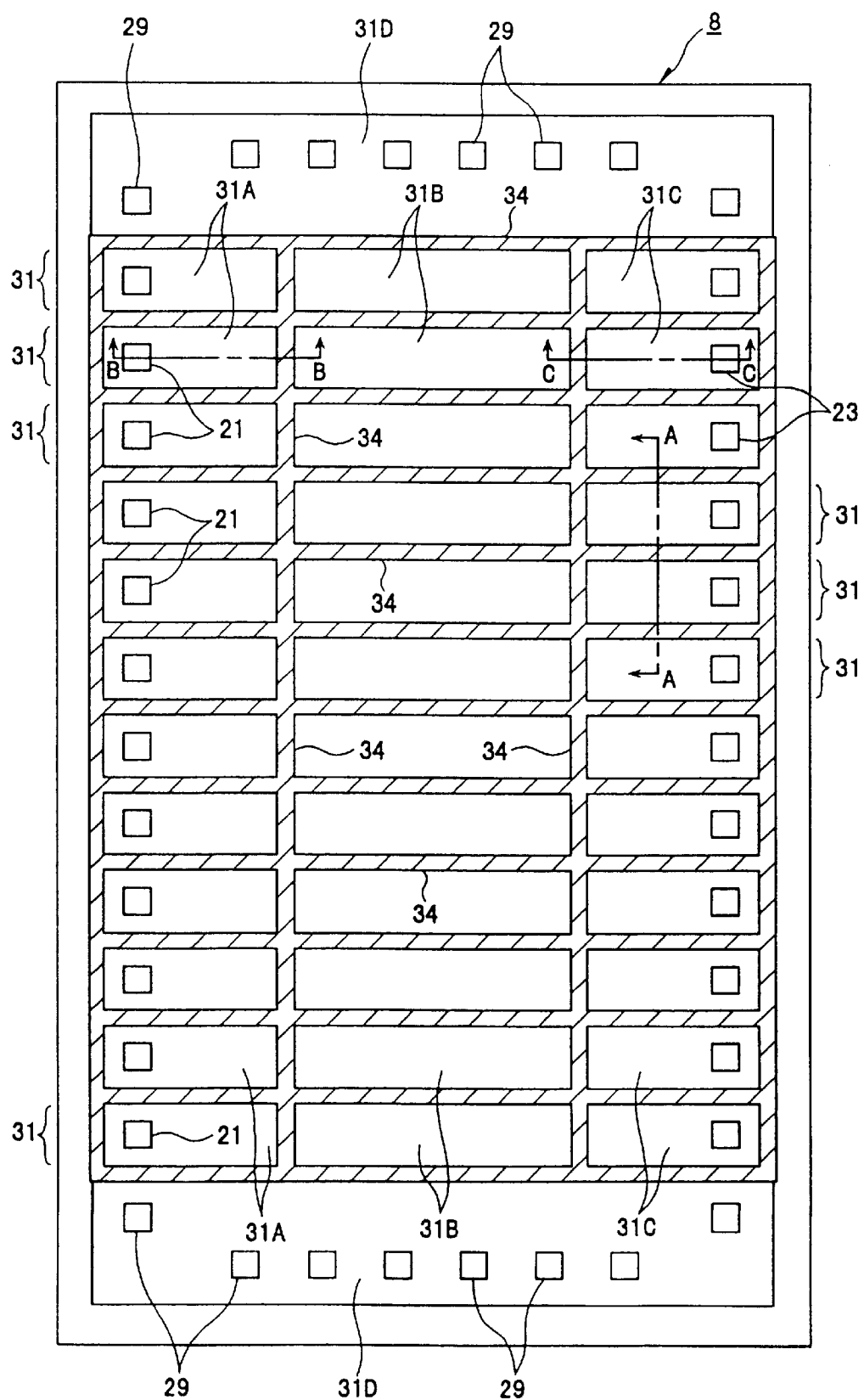
FIG. 3 is a plan layout diagram of the receiving IC shown in FIG. 1.

Each of separation regions 32 separates between the adjacent channel forming regions 31 of the semiconductor layer 30. A conductive material or conductor 34 comprised of an n-type semiconductor region having a high impurity concentration of about $2.5 \times 10^{19}$ [atoms/cm$^3$], for example, is provided in the separation region 32. The conductor 34 is electrically isolated from each channel forming region 31 of the semiconductor layer 30C by the insulators 32 embedded in the trenches which reach the insulating layer 30B as viewed in the direction of the depth of the semiconductor layer 30C from the surface thereof. Further, the conductor 34 is electrically connected to its corresponding each wiring 36B fixed to the reference potential (e.g., 0 [V] potential). Namely, the conductor 34 electrically isolated from each channel forming region 31 and fixed to the reference potential is provided between the channel forming regions 31 of the semiconductor layer 30C as shown in FIGS. 3 and 4. Incidentally, the n-type semiconductor region having a high impurity concentration, which serves as the conductor 34, is formed by selectively introducing, for example, phosphor (P) or arsenic (As) into each separation region 32 as an impurity by an ion implantation method.

Figure 5:
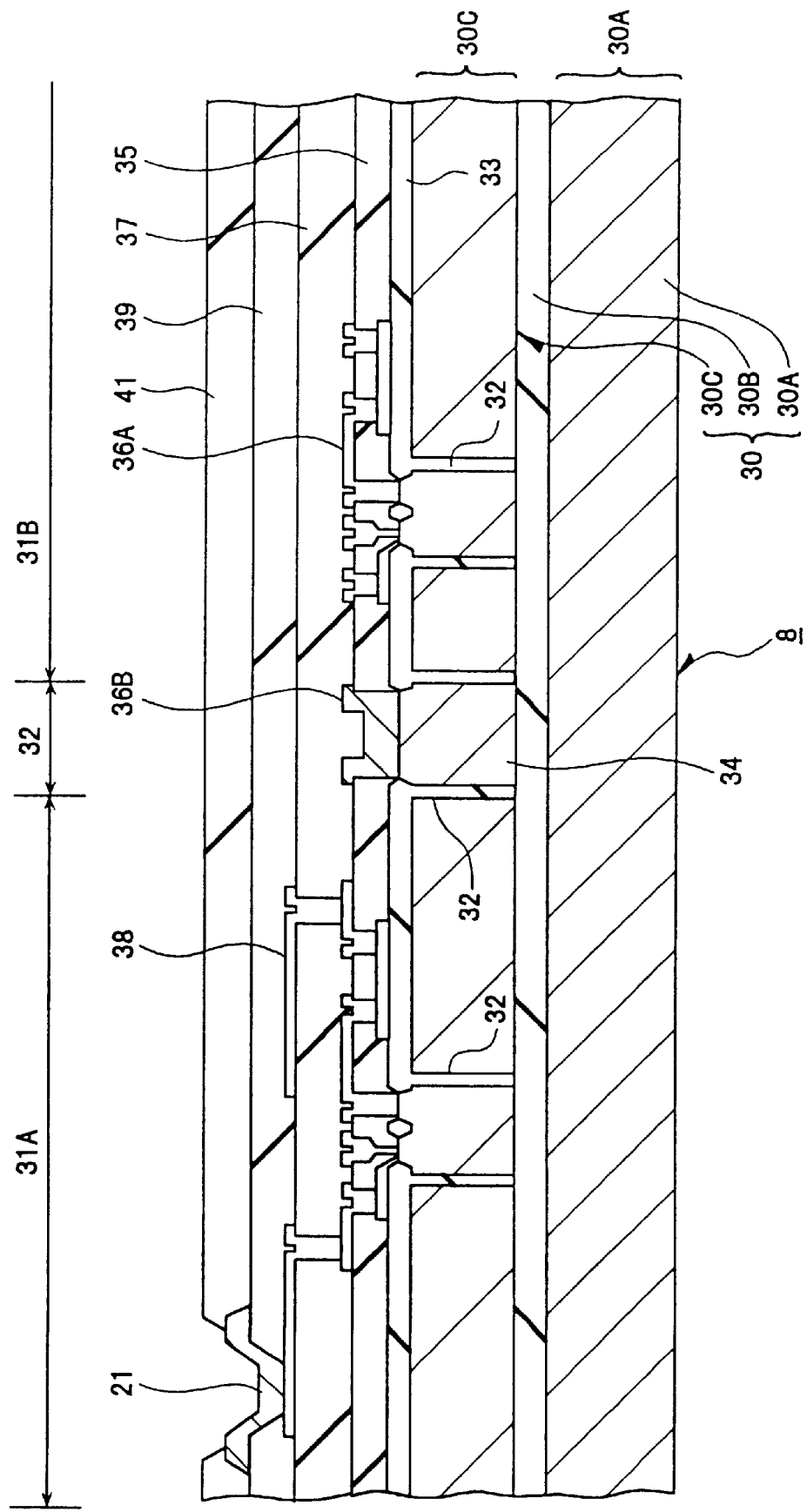
FIG. 5 is a cross-sectional view cut at a position taken along line B—B shown in FIG. 3.

In each of the signal converting means 22 shown in FIG. 2, the input preamplifier circuit 24, which performs the analog operation, is formed in an input circuit forming portion 31A of the channel forming region 31 of the semiconductor layer 30C shown in FIGS. 3 and 5. Further, the internal buffer circuit 25, the timing control circuit 26 and the internal buffer circuit 27 all of which are digitally operated, are respectively formed in an internal circuit forming portion 31B of the channel forming region 31 of the semiconductor layer 30C shown in FIGS. 3, 5 and 6. Furthermore, the digitally-operated output buffer circuit 28 is formed in an output circuit forming portion 31C shown in FIGS. 3 and 6.

The input circuit forming portion 31A in which the input preamplifier circuit 24 is formed, is enclosed on all sides by the separation regions 32 with the conductor 34 provided therein and is electrically separated from other circuit forming portions. The internal circuit forming portion 31B in which the internal buffer circuit 25, the timing control circuit 26 and the internal buffer circuit 27 are formed, is enclosed on all sides by the separation regions 32 with the conductor 34 provided therein and is electrically separated from other circuit forming portions. The output circuit forming portion 31C in which the output buffer circuit 28 is formed, is enclosed on all sides by the separation regions 32 with the conductor 34 provided therein and is electrically separated from other circuit forming portions.

Namely, as shown in FIG. 3, the input circuit forming portion 31A of each channel forming region 31 of the semiconductor layer 30 is enclosed on all sides by the conductor 34 electrically separated from the channel forming region 31 and fixed to the reference potential. Further, the input circuit forming portion 31A, the internal circuit forming portion 31B and the output circuit forming portion 31C of each channel forming region 31 of the semiconductor layer 30 are respectively enclosed on all sides every individuals by the conductor 34 electrically separated from the channel forming region 31 and fixed to the reference potential.

Figure 6:
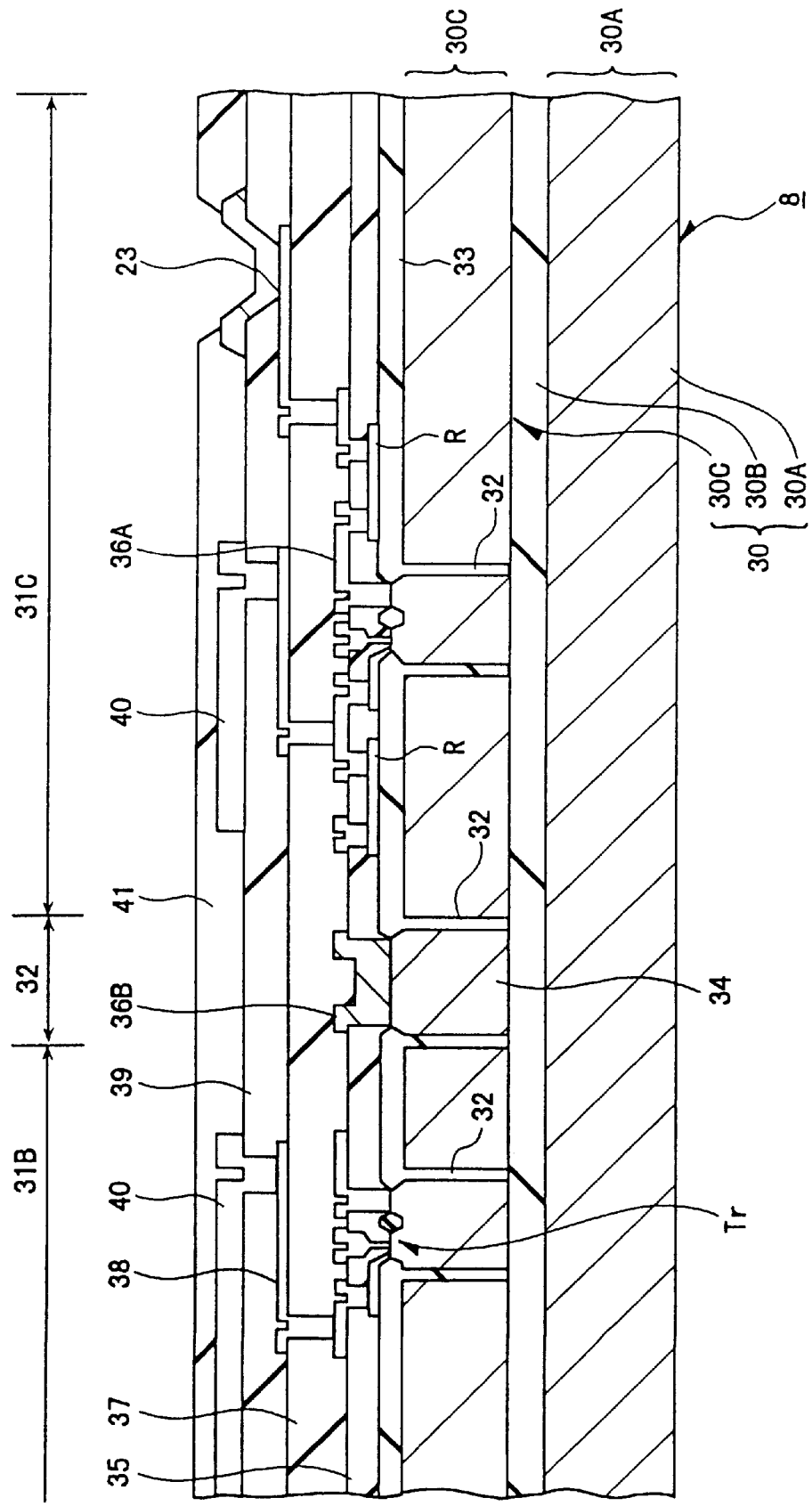
FIG. 6 is a cross-sectional view cut at a position taken along line C—C shown in FIG. 3.

As shown in FIGS. 3 and 5, the input terminals 21 shown in FIG. 2 are formed in the wiring layer corresponding to the third layer and placed on their corresponding input circuit forming portions 31A of the channel forming regions 31 of the semiconductor layer 30C. Further, the output terminals 23 shown in FIG. 2 are formed in the wiring layer corresponding to the third layer and placed on their corresponding output circuit forming portions 31C of the channel forming regions 31 of the semiconductor layer 30C as shown in FIGS. 3 and 6.

Incidentally, a power supply, a DC control circuit, etc. are formed in each of circuit forming portions 31D of the semiconductor layer (30C) in FIG. 3. Further, respective terminals 29 (electrode pads) such as power supply potential terminals to each of which a power supply potential is applied, reference potential terminals to each of which a reference potential is applied, control signal terminals to each of which a control signal is applied, etc. are placed on the circuit forming portions 31D.

Figure 9:
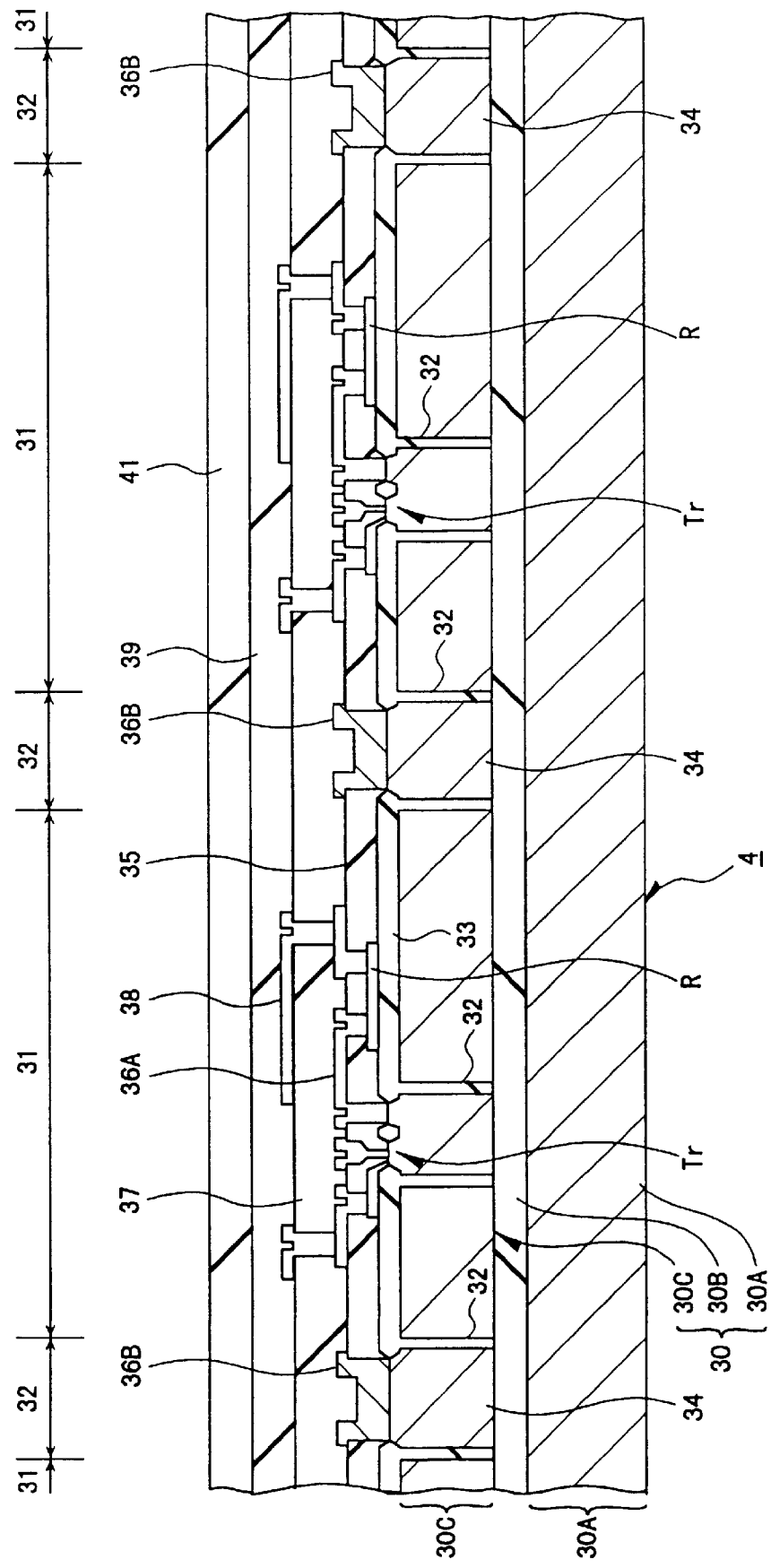
FIG. 9 is a cross-sectional view cut at a position taken along line D—D shown in FIG. 8.

As shown in FIG. 9, the transmitting IC 4 shown in FIG. 7 principally comprises a semiconductor substrate 30 in which a semiconductor layer 30C is provided over a semiconductor layer 30A with an insulating layer 30B interposed therebetween, in a manner similar to the receiving IC 8. Namely, the transmitting IC 4 is structurally substantially identical to the receiving IC 8.

As shown in FIG. 9, each of the signal converting means 12 shown in FIG. 7 is formed in a channel forming region 31 of the semiconductor layer 30C defined for each channel. Although not shown in detail in the drawing, bipolar transistor elements Tr are shown in FIG. 9 as transistor elements which constitute the signal converting means 22.

Figure 8:
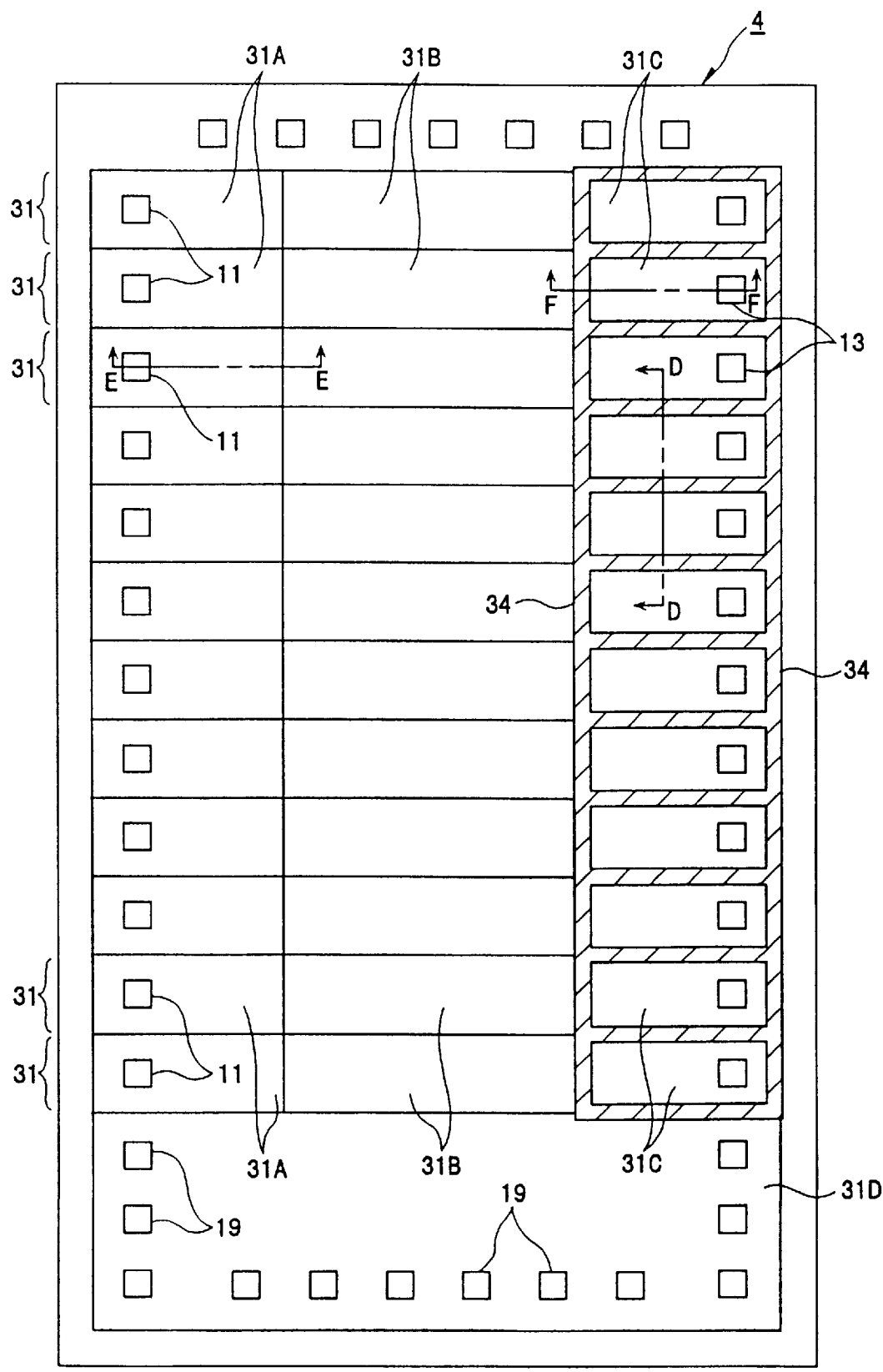
FIG. 8 is a plan layout diagram of the transmitting IC shown in FIG. 1.
Figure 10:
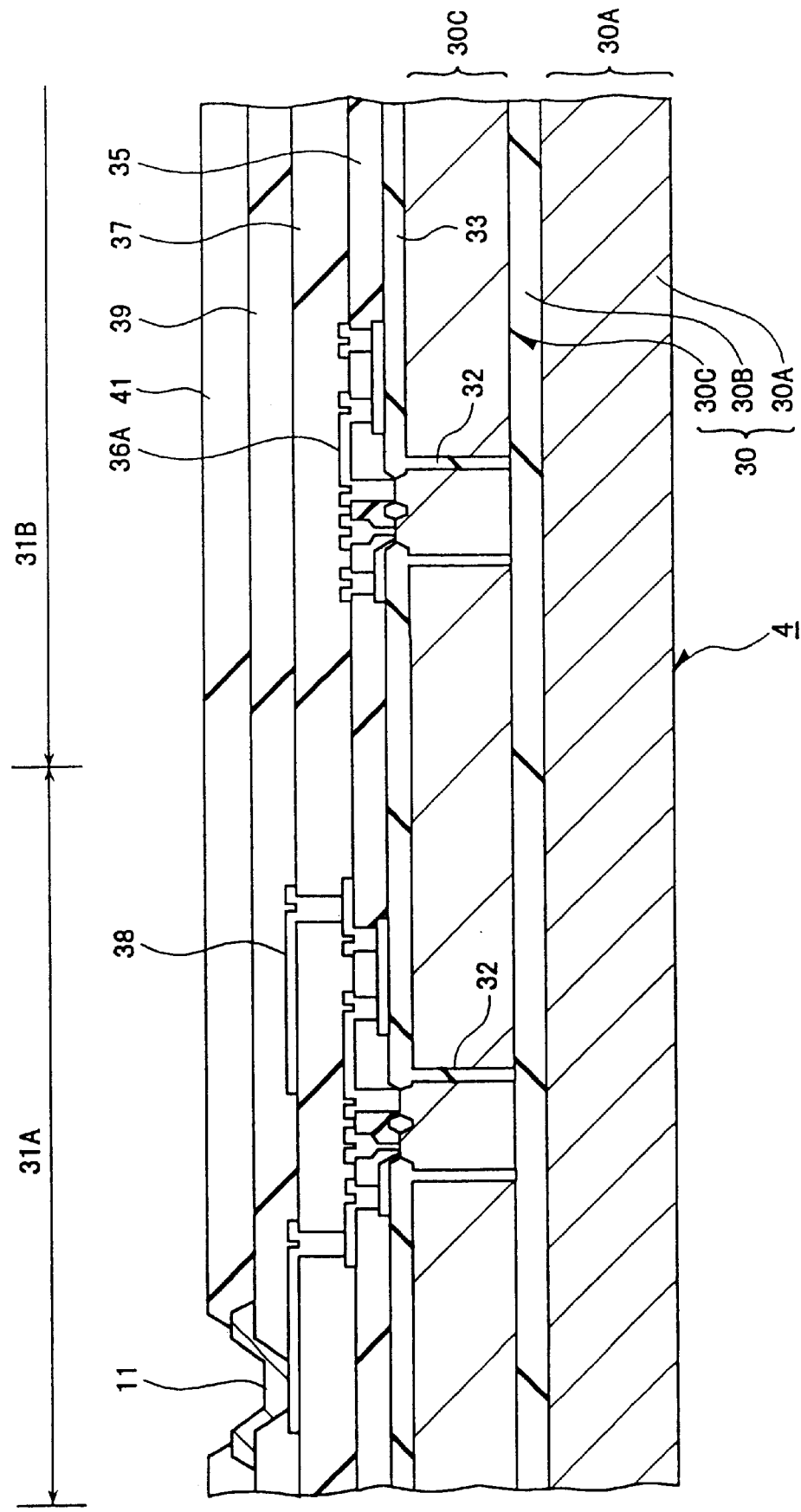
FIG. 10 is a cross-sectional view cut at a position taken along line E—E shown in FIG. 8.

In each of the signal converting means 12 shown in FIG. 7, the digitally-operated input buffer circuit 14 is formed in an input circuit forming portion 31A of the channel forming region 31 of the semiconductor layer 30C shown in FIGS. 8 and 10. Further, the internal buffer circuit 15, the timing control circuit 16 and the internal buffer circuit 17 all of which are digitally operated, are respectively formed in an internal circuit forming portion 31B of the channel forming region 31 of the semiconductor layer 30C shown in FIGS. 8, 10 and 11. Furthermore, the analog-operated light-emitting device drive circuit 18 is formed in an output circuit forming portion 31C of the channel forming region 31 of the semiconductor layer 30C shown in FIGS. 8 and 11.

The output circuit forming portion 31C in which the analog-operated light-emitting device drive circuit 18 is formed, is enclosed on all sides by separation regions 32 with a conductor 34 provided therein and is electrically separated from other circuit forming portions. The conductor 34 is electrically isolated from each channel forming region 31 of the semiconductor layer 30C by insulators 32 embedded in trenches which reach the insulating layer 30B as viewed in the direction of the depth of the semiconductor layer 30C from the surface thereof. Further, the conductor 34 is electrically connected to its corresponding each wiring 36B fixed to the reference potential (e.g., 0 [V] potential). Namely, the output circuit forming portion 31C of the channel forming region 31 of the semiconductor layer 30C is enclosed on all sides by the conductor 34 electrically isolated from the channel forming region 31 and fixed to the reference potential.

Figure 11:
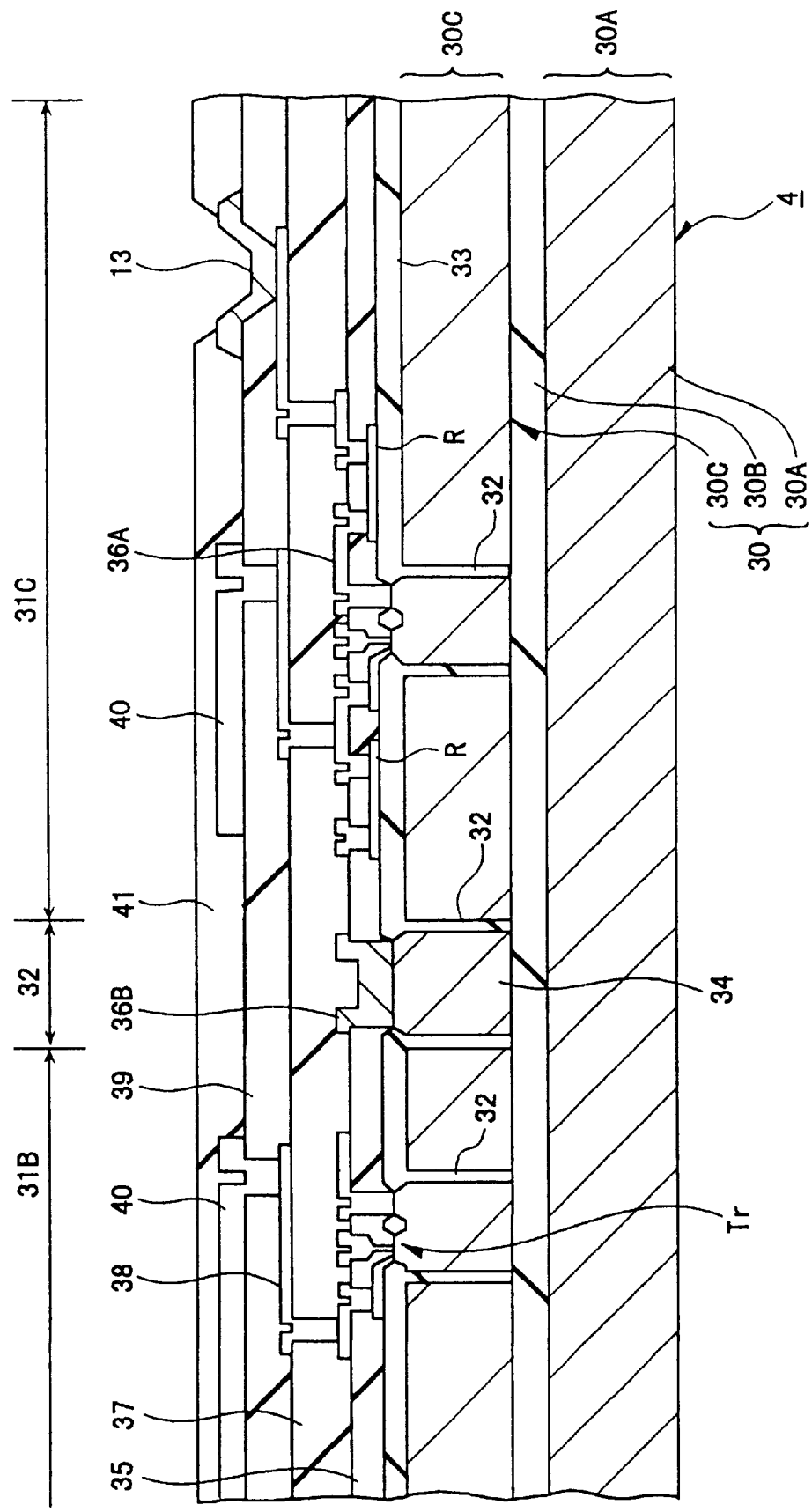
FIG. 11 is a cross-sectional view cut at a position taken along line F—F shown in FIG. 8.

As shown in FIGS. 8 and 10, input terminals 11 shown in FIG. 7 are formed in a wiring layer corresponding to a third layer and placed on their corresponding input circuit forming portions 31A of the channel forming regions 31 of the semiconductor layer 30C. Further, output terminals 13 shown in FIG. 7 are formed in the wiring layer corresponding to the third layer and placed on their corresponding output circuit forming portions 31C of the channel forming regions 31 of the semiconductor layer 30C as shown in FIGS. 8 and 11.

Incidentally, a power supply, a DC control circuit, etc. are formed in a circuit forming portion 31D of the semiconductor layer (30C) in FIG. 8. Further, respective terminals 19 (electrode pads) such as a power supply potential terminal to which a power supply potential is applied, a reference potential terminal to which a reference potential is applied, a control signal terminal to which a control signal is applied, etc. are placed on the circuit forming portion 31D.

A description will next be made of crosstalk produce through the substrate with reference to FIGS. 12 through 16.

Figure 12:
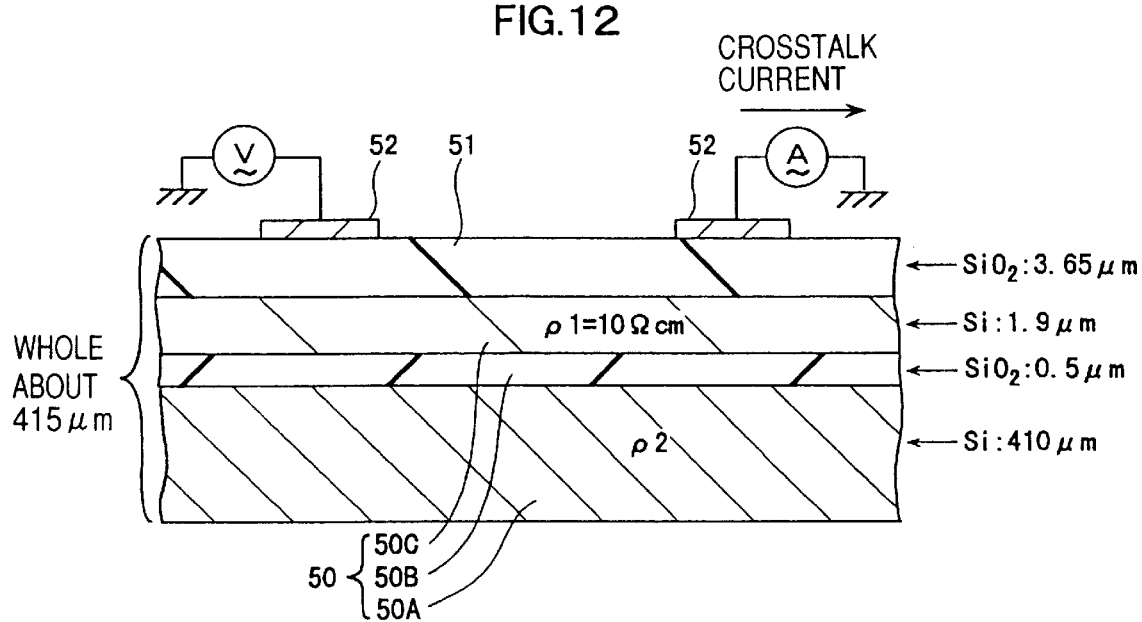
FIG. 12 is a diagram for describing the measurement of a crosstalk current.
Figure 13:
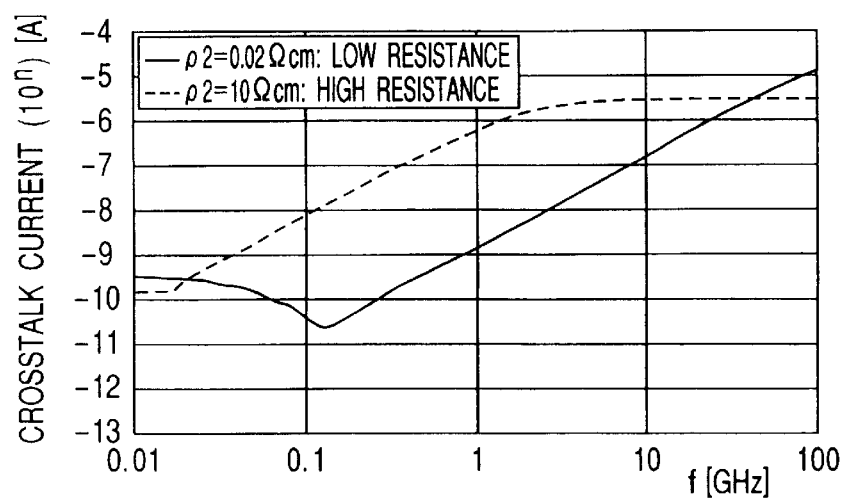
FIG. 13 is a diagram showing the relationship between the frequency and the crosstalk current.

As a result of measurements of crosstalk currents by using a chip having a structure shown in FIG. 12, data shown in FIG. 13 was obtained. The chip has a structure in which electrode pads 52 are provided over a semiconductor substrate 50 with an insulating layer 51 comprised of silicon oxide being interposed therebetween. The semiconductor substrate 50 has a structure similar to that employed in the aforementioned embodiment, i.e., a structure wherein a semiconductor layer 50C comprised of monocrystal silicon is provided over a semiconductor layer 50A comprised of monocrystal silicon with an insulating layer 50B comprised of silicon oxide being interposed therebetween. The crosstalk current measurements were done using a chip in which the resistivity of the semiconductor layer 50A is about 0.02 [Ωcm] and a chip in which the resistivity of the semiconductor layer 50A is about 10 [Ωcm]. A measurement result shown in FIG. 13 will be described qualitatively with reference to FIG. 14.

(A) Since the impedance of C2 greatly increases at a low frequency (a region of 20 [MHz] or less in FIG. 13), the crosstalk current depends on I1 and the dependence of the semiconductor layer 50A on the resistance is small.

(B) When the frequency increases with respect to (A), the impedance of C2 becomes small and the influence of I2 on crosstalk appears. However, the ratio between I21 and I22 is affected by the resistance of the semiconductor layer 50A and the frequency therefor, and the crosstalk current starts to increase at a certain frequency. In a high-resistance semiconductor layer 50A, the crosstalk current starts to increase in the vicinity of 15 [MHz]. In a low-resistance semiconductor layer 50A, it starts to increase in the vicinity of 120 [MHz]. Since the high-resistance semiconductor layer 50A is large in R2b, the crosstalk current starts to increase from a lower frequency.

(C) Since C1 and C2 are considered to be short-circuited at a high frequency, the crosstalk current extremely approximates a given value. In the case of the high-resistance semiconductor layer 50A, the crosstalk current becomes constant from the neighborhood of 4 [GHz]. Since the low-resistance semiconductor layer 50A is low in resistance value, the extreme approximation of the crosstalk current does not appear in a range shown in FIG. 13. When C is considered to be short-circuited, the crosstalk current becomes dominant in I2, and the low-resistance semiconductor layer 50A low in R2a increases in crosstalk current.

Thus, the resistivity of the semiconductor layer 30A is set lower than that of the semiconductor layer 30C as in the aforementioned embodiment to thereby allow a reduction in the amount of transfer of noise power developed through the substrate although there is a limitation on a frequency band. It is therefore possible to reduce crosstalk developed between adjacent channels.

Figure 15:
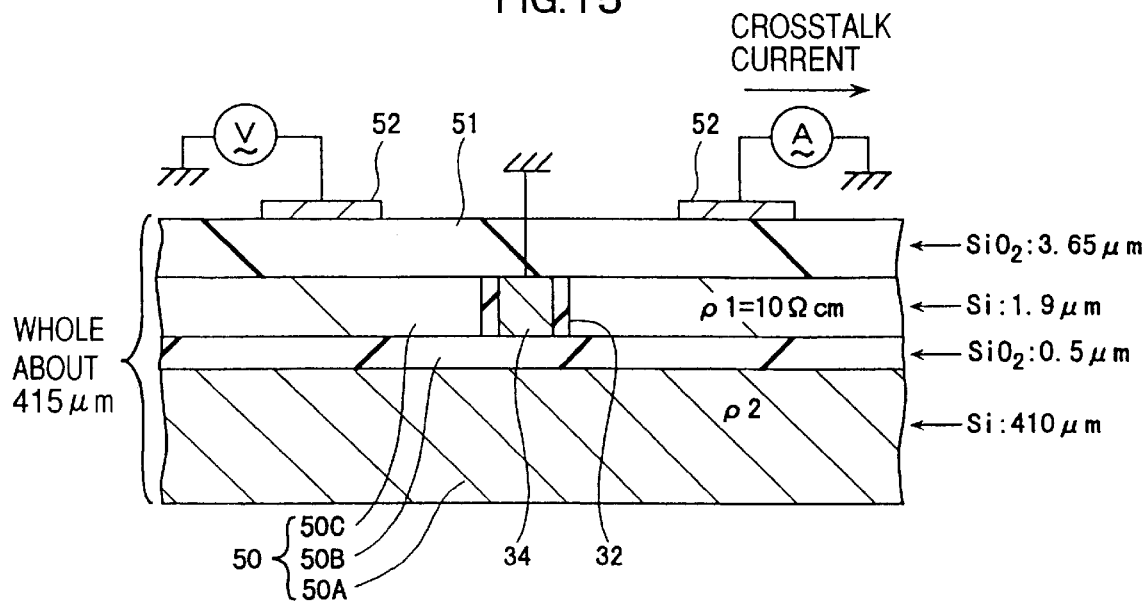
FIG. 15 is a diagram for describing the measurement of a crosstalk current.
Figure 16:
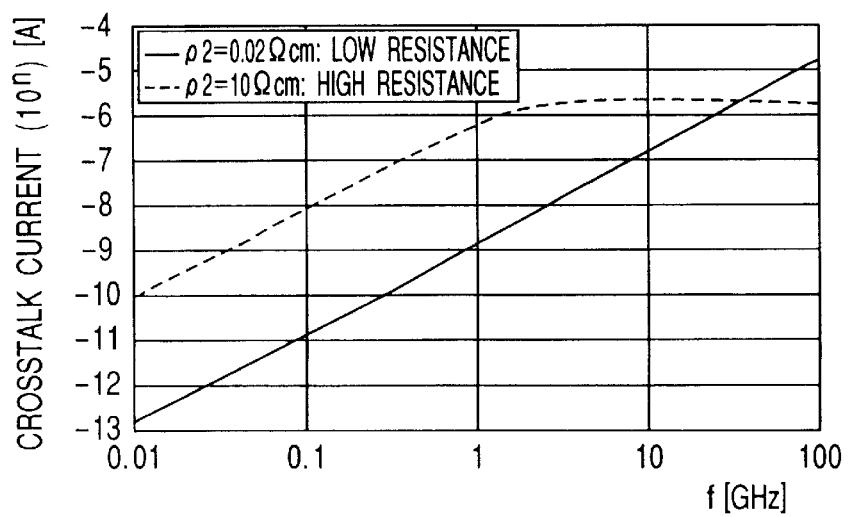
FIG. 16 is a diagram showing the relationship between the frequency and the crosstalk current.

As a result of measurements of crosstalk currents by using a chip having a structure shown in FIG. 15, data shown in FIG. 16 was next obtained. The chip has a structure in which electrode pads 52 are provided over a semiconductor substrate 50 with an insulating layer 51 comprised of silicon oxide being interposed therebetween. The semiconductor substrate 50 has a structure similar to that employed in the aforementioned embodiment, i.e., a structure wherein a semiconductor layer 50C comprised of monocrystal silicon is provided over a semiconductor layer 50A comprised of monocrystal silicon with an insulating layer 50B comprised of silicon oxide being interposed therebetween. Further, the chip takes a structure wherein a conductive material or conductor 34 electrically isolated from the semiconductor layer 50C and fixed to the reference potential is provided in a region of the semiconductor layer 50C, which is opposed to a region defined between the electrode pads 52. The crosstalk current measurements were carried out using a chip in which the resistivity of the semiconductor layer 50A is about 0.02 [Ωcm] and a chip in which the resistivity of the semiconductor layer 50A is about 10 [Ωcm].

Figure 14:
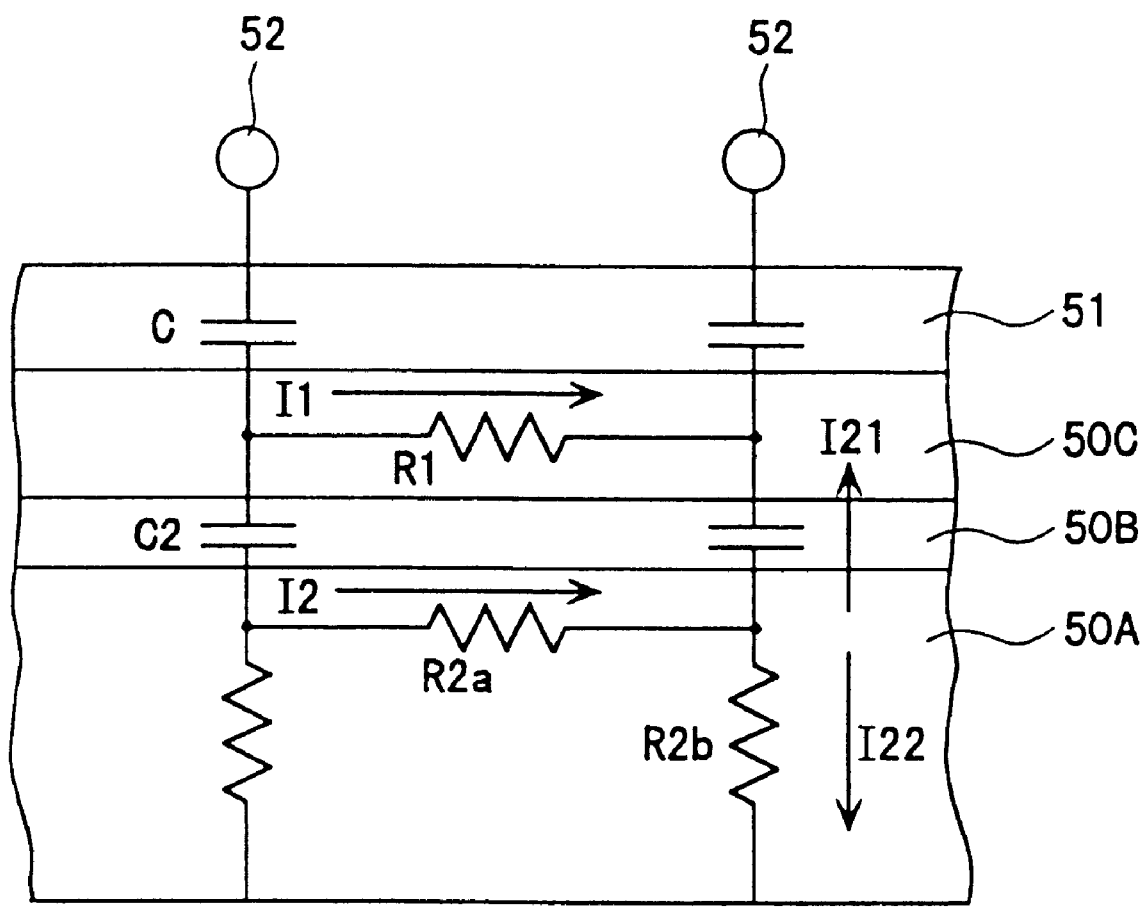
FIG. 14 is an equivalent circuit diagram for describing the generation of a crosstalk current.

A measurement result shown in FIG. 16 will be described qualitatively with reference to FIG. 14. Since the current I1 assumes capacitive coupling owing to the provision of an insulator 32 for electrically separating the semiconductor layer 50C and the conductor 34 from each other, a crosstalk current in a low-frequency band becomes small.

Thus, since the amount of transfer of noise power developed through the substrate in the low-frequency band can be reduced by providing the conductor 34 electrically isolated from each channel forming region 31 and fixed to the reference potential between the channel forming regions 31 of the semiconductor layer 30C as in the aforementioned embodiment, crosstalk developed between adjacent channels can be reduced.

On the other hand, the conductor 34 can be considered to be a metal plate if a viewpoint is changed. Similarly, the semiconductor layer 30A can also be regarded as the metal plate in the same manner. Namely, if a circuit portion which handles a small signal, is regarded as a rectangular parallelepiped, then the same effect as the ability to surround the five of the six sides thereof by a metal can be brought about. When another noise source interferes in a circuit, the impedance between each terminal subjected to noise and a layer for separation of the terminal from a substrate results in input impedance relative to noise. As the output impedance of a noise source and the input impedance relative to the noise approach each other, the amount of transfer of noise power from the noise source increases. The upper surface of a semiconductor can be held in a substantially insulated state by air or vacuum, and interference caused by its crosstalk may be considered to result from electromagnetic induction alone. Further, the input impedance with respect to the noise can be considered as infinite. Therefore, the amount of transfer of the noise power becomes small. Since a substrate normally having a sheet resistance of about 10 [Ω] on the substrate side is used compared to this, an increase in the input impedance with respect to the noise cannot be done in any other way but an increase in distance from the noise source. A reduction in the resistance of the semiconductor layer 30A and the provision of the conductor 34 means that the resistance value of one like a metal results in the input impedance relative to the noise. Thus, this can greatly be reduced as compared with the output impedance of the noise source, and the amount of transfer of the noise power can be lowered.

It is desirable that a current signal of from several tens of [$\mu A$] to a few hundreds of [$\mu A$] is inputted to a front end of the receiving IC 8 employed in the present embodiment in 12-channel parallel arrangements, and the front end thereof is capable of receiving each signal even if signals inputted to each individual channels are not correlated to one another in amplitude. The output of the receiving IC 8 is a digital signal, which results in a signal amplitude of about a power supply voltage equivalent to 3 [V] or so in the case of a CMOS structure, and which results in a signal amplitude of about 0.8 [V] even in the case of bipolar. It is thus desirable that input signal-to-input signal crosstalk, which enters between the respective channels, is about −40 [dB]. Since the amplitude of each input signal is converted to a range of several tens of 10 [mV] to a few hundreds of [mV] assuming that the input impedance of the receiving IC 8 is 1 [KΩ], the input-to-input crosstalk may desirably be about −60 [dB].

Since the low-resistance conductor 34 and the low-resistance semiconductor layer 30A completely separate the input preamplifier circuits 24 each of which handles the small signal, from other circuit units which handle a large signal, such as digital units, etc. as described above, the crosstalk between the adjacent channels can be minimized.

If the crosstalk exists between the channels, then a signal for one channel, which is inputted as the minimum signal, is subjected to interference from other channels, and particularly, noise is overlaid thereon at a switching point between 1 and 0. In the case of optical interconnect, a point for identifying 1 and 0 of each input signal is normally set to a point smaller than the minimum value of one received-signal's amplitude determined by a system in order to guarantee a dc operation. Therefore, the crosstalk noise is easily recognized as erroneous in one signal. While multi-channel parallel transmission is done in the case of the optical interconnect, the signal is transmitted so as to be synchronized between the channels at the switching point between 1 and 0. However, a phenomenon occurs in which the switching point between 1 and 0, which is called skew, is shifted between the channels due to a difference in receive power between the channels, a difference in characteristic of each laser diode, etc. In this case, the channel-to-channel crosstalk will reproduce the switching point between 1 and 0 at places to be originally avoided with respect to signals for other channels. Therefore, a temporal width of data becomes substantially narrow and hence an error occurs in the data.

If the crosstalk developed between the adjacent channels can be reduced as described above, then a data skew can be lessened, and by extension an improvement in transmission rate, an enlargement of a transmission distance, an improvement in reliability, etc. are expected by distributing a margin corresponding to its reduction to others.

According to the present embodiment as described above, the following advantageous effects are obtained.

(1) The semiconductor layer 30A is formed with resistivity smaller than that of the semiconductor layer 30C and fixed to the reference potential.

Since the amount of transfer of noise power developed through the semiconductor substrate 30 can be reduced by virtue of such a construction, the channel-to-channel crosstalk can be lessened.

Since the crosstalk developed between the adjacent channels can be reduced, the receiving module and the transmitting module can be improved in reliability.

(2) The conductor 34 electrically isolated from each channel forming region 31 and fixed to the reference potential is provided between the adjacent channel forming regions 31 of the semiconductor layer 30C.

Since the amount of transfer of noise power developed through the semiconductor substrate 30 in the low-frequency band can be decreased by virtue of such a construction, the crosstalk between the adjacent channels can be reduced.

Since the crosstalk developed between the adjacent channels can be reduced, the receiving module and the transmitting module can be improved in reliability.

(3) In the receiving module, the periphery of the input circuit forming portion 31A of each channel forming region 31 of the semiconductor layer 30C is surrounded by the conductor 34 electrically separated from the channel forming region 31 and fixed to the reference potential.

Even in the case of such a construction, the crosstalk between the adjacent channels can be reduced. It is also possible to increase the reliability of the receiving module.

(4) In the receiving module, the respective peripheries of the input circuit forming portion 31A, the internal circuit forming portion 31B and the output circuit forming portion 31C of each channel forming region 31 of the semiconductor layer 30C are surrounded every individuals by the conductor 34 electrically separated from the channel forming regions 31 and fixed to the reference potential.

Even in the case of such a construction, the crosstalk developed between the adjacent channels can be reduced. It is also possible to increase the reliability of the receiving module.

(5) In a transmitting module, the periphery of the output circuit forming portion 31A of each channel forming region 31 of the semiconductor layer 30C is surrounded by the conductor 34 electrically separated from the channel forming region 31 and fixed to the reference potential.

Even in the case of such a construction, the crosstalk developed between the adjacent channels can be reduced. It is also possible to increase the reliability of the transmitting module.

(6) Since the optical interconnect is defined as transmission using an optical fiber, it has little bearing on a transmission loss from the viewpoint of a low loss property of the optical fiber. A transmission distance for the optical interconnect is determined by a skew. If the optical interconnect is applied between boards of an optical transmission device, an exchanger, a parallel computer and a general-purpose large computer or between these apparatuses by using the receiving IC or the transmitting IC to which the present invention is applied, then the skew can be reduced. It is therefore possible to freely set the distance between the boards or between the apparatuses and facilitate even the extension of a system. Since the parallel transmission is originally defined as a base, even a simplified LAN so high in throughput can be configured.

(7) Since the crosstalk developed between the adjacent channels can be reduced, an optical interconnect communication system can achieve an improvement in transmission rate, an increase in transmission distance and an improvement in reliability.

Incidentally, the present embodiment has described the example in which the conductor 34 comprised of the n-type semiconductor region having the high impurity concentration is provided in the separation regions 32 of the semiconductor layer 30C. However, the present invention is not limited to it. For example, the conductor 34 may be formed by defining trenches in the separation regions 32 of the semiconductor layer 30C and embedding a polycrystal silicon film with an impurity introduced therein into the trenches.

Further, the present embodiment has described the example in which the periphery of the output circuit forming portion 31A of each channel forming region 31 of the semiconductor layer 30C is surrounded by the conductor 34 electrically separated from the channel forming region 31 and fixed to the reference potential in the transmitting IC 4. However, the conductor 34 may be provided between the adjacent channel forming regions 31 of the semiconductor layer 30C. Even in the case of such a construction, crosstalk developed between adjacent channels can be reduced. It is also possible to increase the reliability of the transmitting module.

(Embodiment 2)

A receiving IC 8 according to the present embodiment is basically similar in structure to the aforementioned embodiment 1 and is different in the following configuration.

Figure 17:
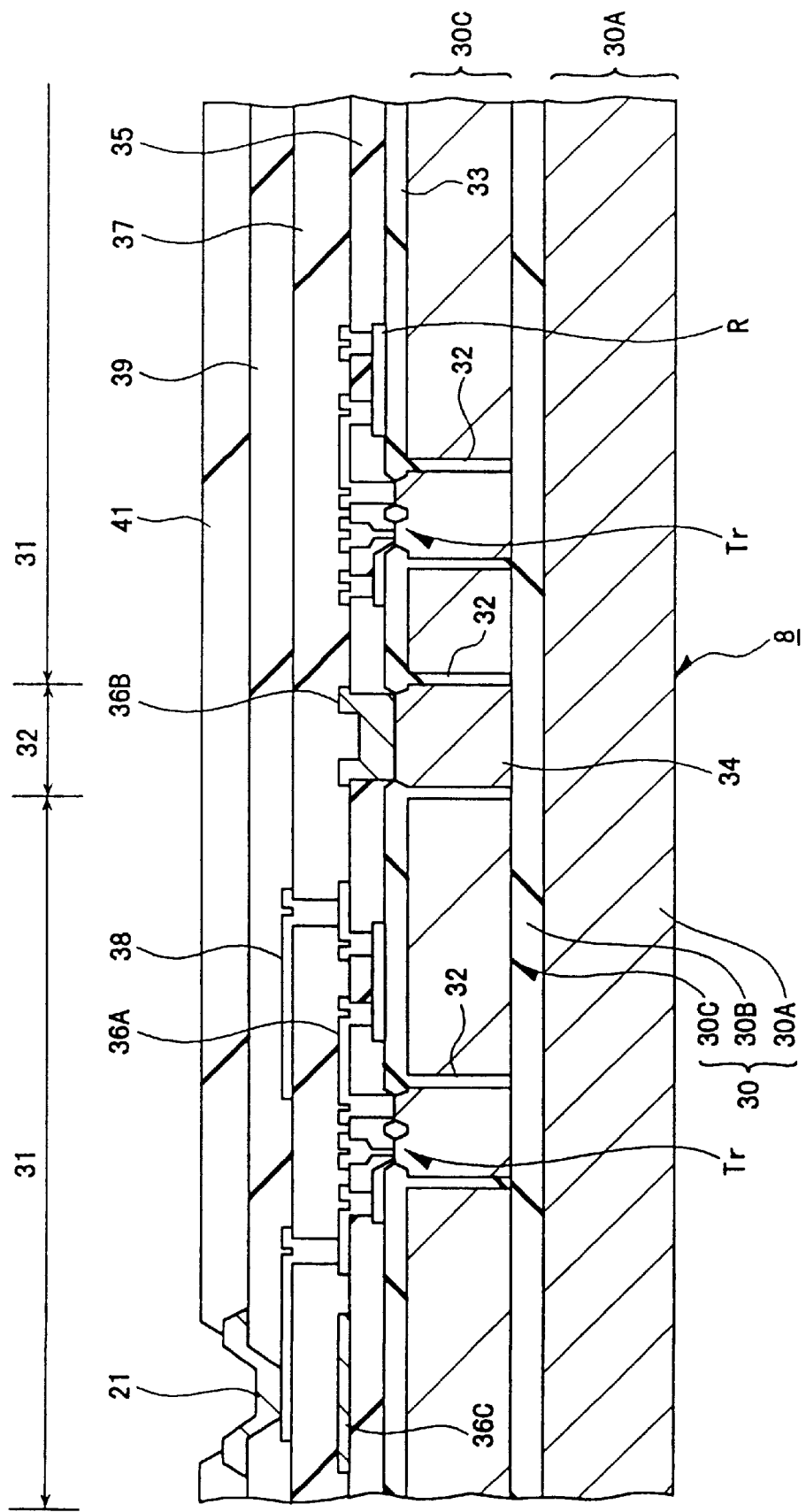
FIG. 17 is a cross-sectional view of a receiving IC mounted in a receiving module employed in an optical interconnect communication system showing an embodiment 2 of the present invention.
Figure 18:
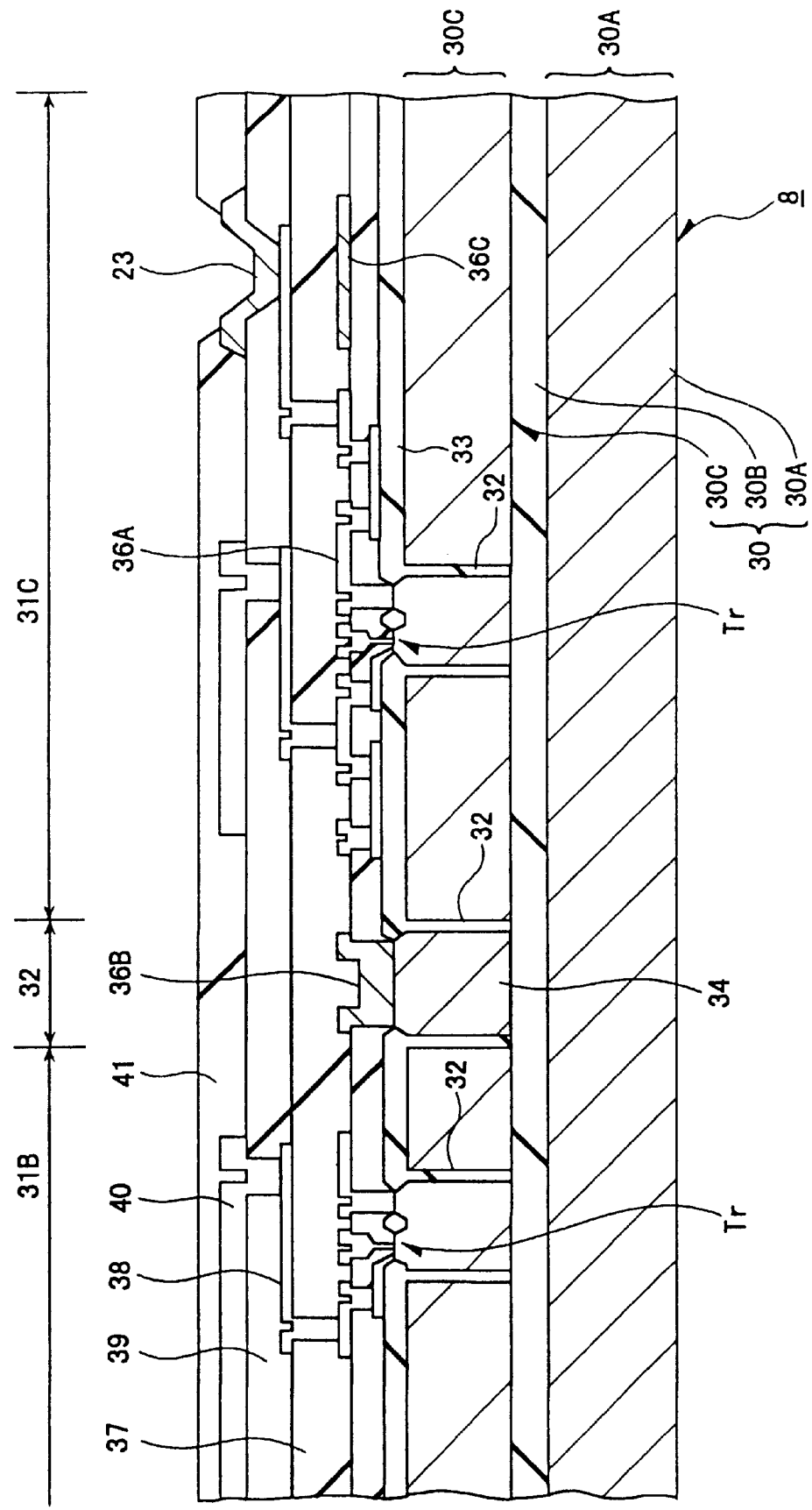
FIG. 18 is a cross-sectional view of a receiving IC placed in a receiving module employed in the optical interconnect communication system showing the embodiment 2 of the present invention.

Namely, as shown in FIG. 17, a conductive material or conductor 36C fixed to a reference potential is provided between each of input terminals 21 and a semiconductor layer 30C. As shown in FIG. 18 as well, a conductor 36C fixed to the reference potential is provided between each of output terminals 23 and the semiconductor layer 30C. While the conductor 36C is not limited to it, it is formed in a wiring layer corresponding to a first layer.

Although not limited to the above, the conductor 36C on the output terminal 23 side extends along the direction of an arrangement of the output terminals 23, for example as shown in FIG. 19. Although not shown in the drawing, the conductor 36C on the input terminal 21 side extend in the direction of an arrangement of the input terminals 21, for example in a manner similar to the conductor 36C on the output terminal 23 side.

Thus, since a semiconductor substrate 30 and each output terminal can be separated from each other by providing the conductor 36C fixed to the reference potential between each output terminal 23 and the semiconductor layer 30C, the amount of transfer of noise power developed through the substrate can be decreased and hence crosstalk developed between adjacent channels can be reduced.

Further, a similar effect is obtained by providing the conductor 36C fixed to the reference potential between each input terminal 21 and the semiconductor layer 30C.

Incidentally, while the receiving IC 8 has been described in the present embodiment, a similar effect is obtained by providing the conductor 36C between the semiconductor layer 30C and the input terminals 11 or between the semiconductor layer 30C and the output terminals 13.

The invention made above by the present inventors has been described specifically by the embodiments. However, the present invention is not necessarily limited to the embodiments. It is needless to say that various changes can be made thereto within the scope not departing from the substance thereof.

INDUSTRIAL APPLICABILITY

It is possible to reduce crosstalk developed between adjacent channels.

A communication module can be improved in reliability.

An optical interconnect communication system is capable of improving a transmission rate, increasing a transmission distance and promoting reliability.

What is claimed is:

1. A communication module, comprising:
a semiconductor chip in which channels for allowing a plurality of signal converting means to convert current signals inputted from input terminals to voltage signals and outputting the same from output terminals respectively are arranged in parallel;
said semiconductor chip being comprised principally of a semiconductor substrate in which a second semiconductor layer is provided on a first semiconductor layer with a first insulating layer interposed therebetween;
each said plurality of signal converting means being formed in a channel forming region of the second semiconductor layer, which is defined for each channel;
said input and output terminals being formed on channel forming regions of the second semiconductor layer with a second insulating layer interposed therebetween; and
wherein portions of said first semiconductor layer under said input and output terminals have a resistivity smaller than that of said second semiconductor layer.

2. The communication module according to claim 1, wherein said first semiconductor layer is fixed to a fixed potential.

3. The communication module according to claim 1, wherein a conductor electrically separated from each said channel forming region and fixed to the fixed potential is provided between the channel forming regions of the second semiconductor layer.

4. The communication module according to claim 3, wherein said conductor is electrically separated from the channel forming regions of said second semiconductor layer by insulators reaching said first insulating layer in the direction of the depth of said second semiconductor layer from the surface thereof.

5. The communication module according to claim 1, wherein each said signal converting means has an input preamplifier circuit which performs an analog operation, and an internal circuit and an output circuit both of which are digitally operated, said input preamplifier circuit is formed in an input circuit forming portion of the channel forming region of the second semiconductor layer, said internal circuit is formed in an internal circuit forming portion of the channel forming region of the second semiconductor layer, said output circuit is formed in an output circuit forming portion of the channel forming region of the second semiconductor layer, and said input circuit forming portion of the channel forming region of the second semiconductor layer is electrically isolated from other regions of the channel forming region and enclosed on all sides by a conductor fixed to a fixed potential.

6. The communication module according to claim 5, wherein each said input terminal is formed on the input circuit forming portion of the channel forming region of said second semiconductor layer.

7. The communication module according to claim 1, wherein each said signal converting means has an input preamplifier circuit which performs an analog operation, and an internal circuit and an output circuit both of which are digitally operated, said input preamplifier circuit is formed in an input circuit forming portion of the channel forming region of the second semiconductor layer, said internal circuit is formed in an internal circuit forming portion of the channel forming region of the second semiconductor layer, said output circuit is formed in an output circuit forming portion of the channel forming region of the second semiconductor layer, and the input circuit forming portion, the internal circuit forming portion and the output circuit forming portion of said each channel forming region of said second semiconductor layer are respectively enclosed on all sides by a conductor electrically separated from the channel forming region and fixed to a fixed potential.

8. The communication module according to claim 7, wherein each said input terminal is formed on the input circuit forming portion and each said output terminal is formed on the output circuit forming portion.

9. The communication module according to claim 1, further including a photoreceptor array unit in which photodiodes for respectively converting light signals to electric signals are arranged in parallel in plural form, and wherein the respective electric signals outputted from said photoreceptor array unit are respectively inputted to the input terminals of said semiconductor chip.

10. A communication module, comprising:

a semiconductor chip in which channels for allowing signal converting means to convert current signals inputted from input terminals to voltage signals and outputting the same from output terminals respectively are arranged in parallel in plural form;

said semiconductor chip being comprised principally of a semiconductor substrate in which a second semiconductor layer is provided on a first semiconductor layer with a first insulating layer interposed therebetween;

said signal converting means being formed in a channel forming region of the second semiconductor layer, which is defined for each channel;

said input and output terminals being formed on the channel forming regions of the second semiconductor layer with a second insulating layer interposed therebetween; and wherein a first conductor fixed to a first fixed potential is provided between the input terminals and the second semiconductor layer.

11. The communication module according to claim 10, wherein a second conductor fixed to a second fixed potential is provided between the output terminals and the second semiconductor layer.

12. A communication module, comprising:

a semiconductor chip in which channels for allowing signal converting means to convert current signals inputted from input terminals to voltage signals and outputting the same from output terminals respectively are arranged in parallel in plural form;

said semiconductor chip being comprised principally of a semiconductor substrate in which a second semiconductor layer is provided on a first semiconductor layer with a first insulating layer interposed therebetween;

said signal converting means being formed in a channel forming region of the second semiconductor layer, which is defined for each channel;

said input and output terminals being formed on the channel forming regions of the second semiconductor layer with a second insulating layer interposed therebetween; and wherein a conductor electrically separated from said each channel forming region and fixed to a fixed potential is provided between the channel forming regions of the second semiconductor layer.

13. The communication module according to claim 12, wherein each said signal converting means has an input preamplifier circuit which performs an analog operation, and an internal circuit and an output circuit both of which are digitally operated, said input preamplifier circuit is formed in an input circuit forming portion of the channel forming region of the second semiconductor layer, said internal circuit is formed in an internal circuit forming portion of the channel forming region of the second semiconductor layer, said output circuit is formed in an output circuit forming portion of the channel forming region of the second semiconductor layer, and said input circuit forming portion of the channel forming region of the second semiconductor layer is electrically isolated from other regions of the channel forming region and enclosed on all sides by the conductor fixed to the fixed potential.

14. The communication module according to claim 12, wherein each said signal converting means has an input preamplifier circuit which performs an analog operation, and an internal circuit and an output circuit both of which are digitally operated, said input preamplifier circuit is formed in an input circuit forming portion of the channel forming region of the second semiconductor layer, said internal circuit is formed in an internal circuit forming portion of the channel forming region of the second semiconductor layer, said output circuit is formed in an output circuit forming portion of the channel forming region of the second semiconductor layer, and the input circuit forming portion, the internal circuit forming portion and the output circuit forming portion of said each channel forming region of said second semiconductor layer are respectively enclosed on all sides by the conductor electrically separated from the channel forming regions and fixed to the fixed potential.

15. The communication module according to claim 12, wherein said conductor is electrically separated from the channel forming regions of said second semiconductor layer by insulators reaching said first insulating layer in the direction of the depth of said second semiconductor layer from the surface thereof.

16. A communication module, comprising:
   a semiconductor chip in which channels for allowing a plurality of signal converting means to convert current signals inputted from input terminals to voltage signals and outputting the same from output terminals respectively are arranged in parallel in plurality form;
   said semiconductor chip being comprised principally of a semiconductor substrate in which a second semiconductor layer is provided on a first semiconductor layer with a first insulating layer interposed therebetween;
   said signal converting means being formed in a channel forming region of the second semiconductor layer, which is defined for each channel;
   said input and output terminals being formed on the channel forming regions of the second semiconductor layer with a second insulating layer interposed therebetween; and
   resistive elements being formed over said second semiconductor layer;
   wherein first portions of said first semiconductor layer under said resistive elements have a resistivity smaller than that of said second semiconductor layer.

17. The communication module according to claim 16, wherein second portions of said first semiconductor layer under said input and output terminals have resistivity smaller than that of said semiconductor layer.

* * * * *